(12) United States Patent
Cho et al.

(10) Patent No.: US 7,851,878 B2
(45) Date of Patent: Dec. 14, 2010

(54) MAGNETIC MEMORY DEVICE AND METHOD OF FABRICATING THE SAME

(75) Inventors: Woo-Yeong Cho, Suwon-si (KR);
Yun-Seung Shin, Seoul (KR);
Hyun-Geun Byun, Yongin-si (KR);
Choong-Keun Kwak, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/507,504

(22) Filed: Jul. 22, 2009

(65) Prior Publication Data
US 2009/0273045 A1 Nov. 5, 2009

Related U.S. Application Data

(62) Division of application No. 11/480,242, filed on Jun. 30, 2006, now Pat. No. 7,582,941.

(30) Foreign Application Priority Data
Aug. 25, 2005 (KR) .................. 10-2005-0078365

(51) Int. Cl.
*H01L 29/82* (2006.01)
*G11C 11/02* (2006.01)

(52) U.S. Cl. ............... 257/421; 257/427; 257/E29.323; 438/3; 360/324.2; 365/158

(58) Field of Classification Search .................. 257/20, 257/414, 421–427, E29.323; 438/3; 365/157–158, 365/171–173; 360/324–326, 313
See application file for complete search history.

(56) References Cited

U.S. PATENT DOCUMENTS 5,640,343 A * 6/1997 Gallagher et al. ........... 365/171
6,642,595 B1 11/2003 Hung et al.

* cited by examiner

*Primary Examiner*—Bradley K Smith
*Assistant Examiner*—Jami M Valentine
(74) *Attorney, Agent, or Firm*—F. Chau & Associates, LLC

(57) ABSTRACT

A magnetic memory device includes a common line; a first write-in diode, a readout diode and a second write-in diode being connected to the common line in parallel. The magnetic memory device further includes a magnetic tunnel junction structure connected to the readout diode, first and second write-in conductors disposed at both sides of the magnetic tunnel junction structure and connected to the first and second write-in diodes, respectively and a first write-in line, a readout line and a second write-in line, which are connected to the first write-in conductor, the magnetic tunnel injection structure, and the second write-in conductor, respectively.

15 Claims, 15 Drawing Sheets

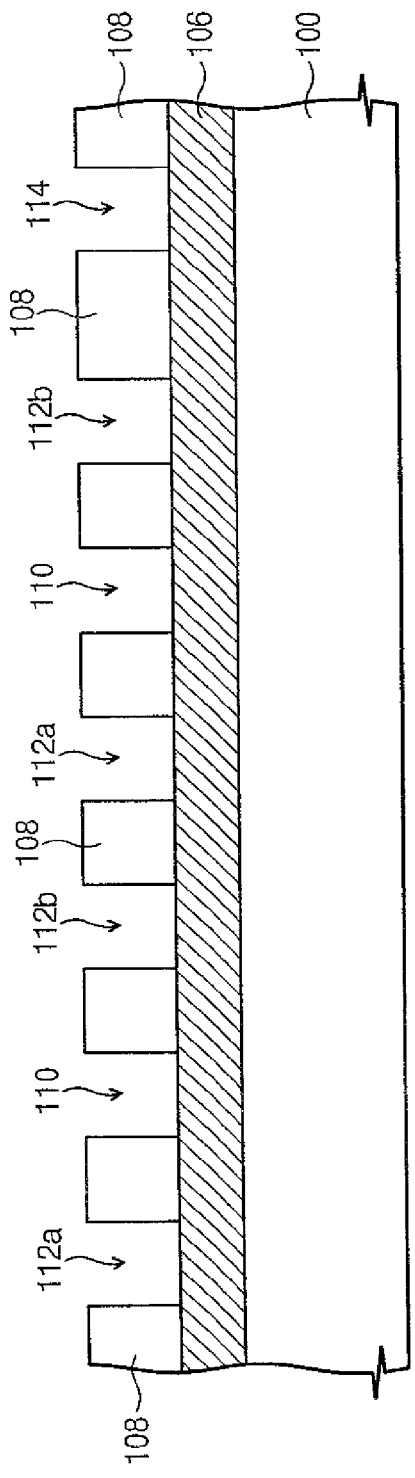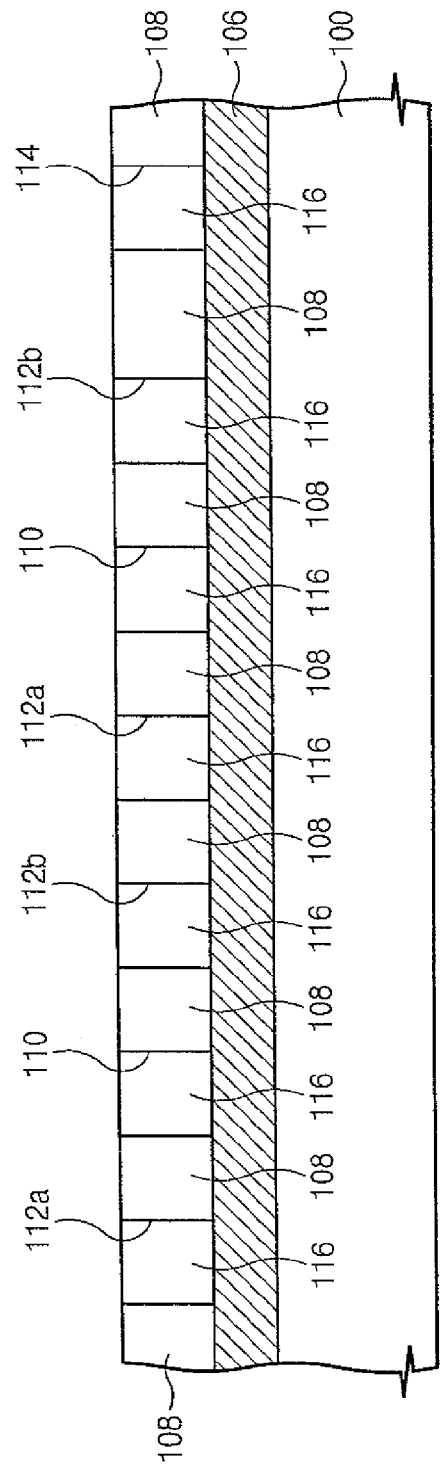

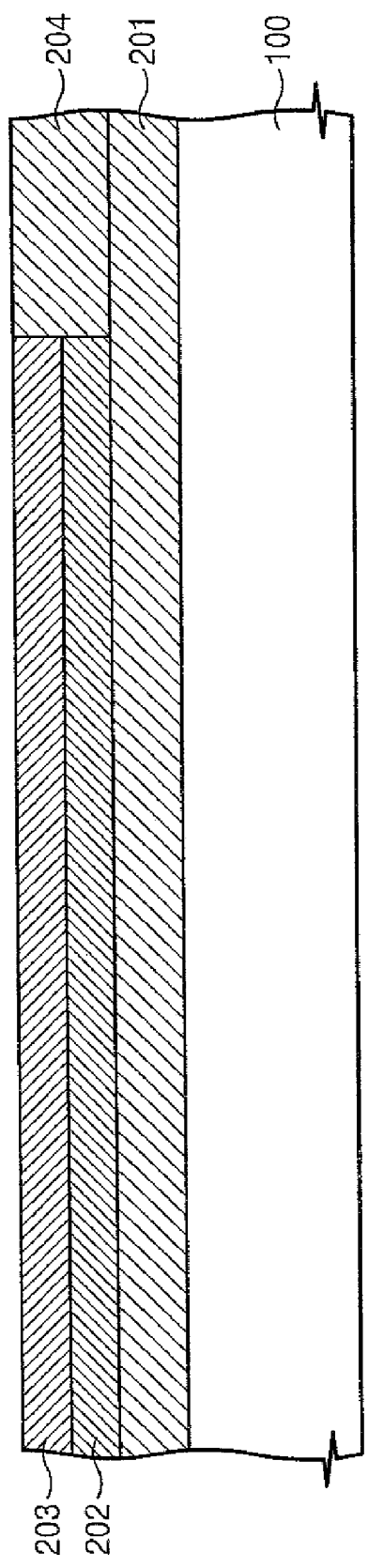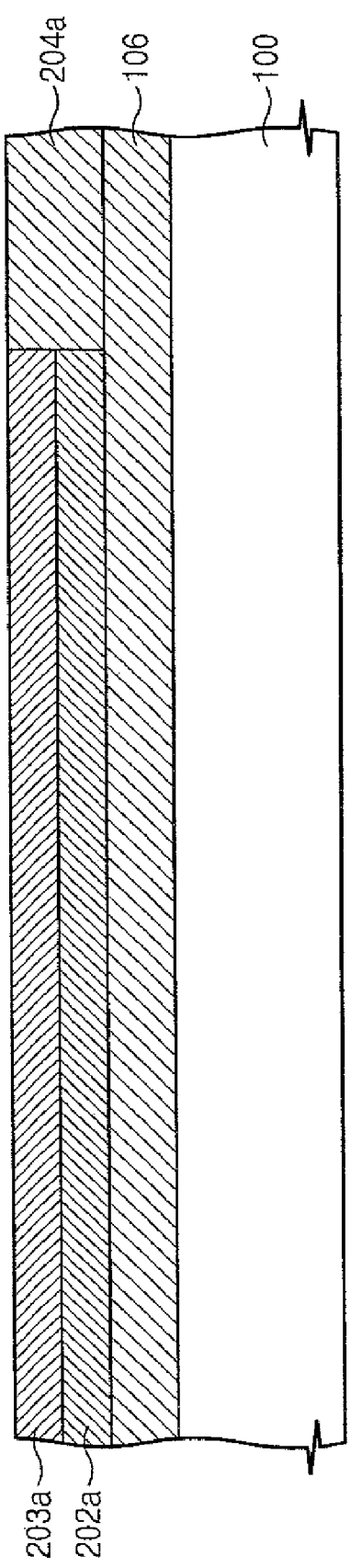

MAGNETIC MEMORY DEVICE AND METHOD OF FABRICATING THE SAME

CROSS-REFERENCE TO RELATED APPLICATIONS

This application is a divisional of U.S. patent application Ser. No. 11/480,242 filed on Jun. 30, 2006 now U.S. Pat. No. 7,582,941, which claims priority to Korean Application No. 2005-78365 filed Aug. 25, 2005, the disclosures of which are hereby incorporated by reference herein in their entireties.

BACKGROUND

The present disclosure relates to semiconductor devices and methods of fabricating the same, and in particular relates to magnetic memory devices and methods of fabricating the same.

Magnetic memory devices are typically defined, for example, as electronic components storing data in a nonvolatile capacity, and which include magnetic tunnel junction (MTJ) structures in which the resistance value varies according the magnetization direction on magnetic layers. Moreover, there is an increasing demand for magnetic memory devices because of, for example, their ability to operate at high frequencies and their re-writing properties. For example, an MTJ configuration may be composed of, two magnetic layers and a tunneling barrier layer interposed between the magnetic layers. The resistance value of the MTJ structure when the magnetization direction of each of the two magnetic layers are arranged in the same direction may be smaller than the resistance value for the MTJ structure when the magnetization direction of the two magnetic layers are aligned in reverse directions to each other. Furthermore, the magnetization direction of each of the above two magnetic layers may be stored as information data in the MTJ as logical values "1" or "0".

Typically, a magnetic memory cell having a MTJ structure is arranged by being connected to bit and digit lines. Such a magnetic memory cell is illustrated as follows.

FIG. 1 is a sectional view showing a conventional magnetic memory device. Referring to FIG. 1, a lower interlevel oxide film 2 is disposed on a semiconductor substrate 1 and a digit line 3 is arranged on the lower interlevel oxide film 2. An intermediate interlevel oxide film 4 covers the digit line 3 and the lower interlevel oxide film 2. A lower plug 5 penetrates the intermediate and lower interlevel oxide films 4 and 2 in sequence to be connected to the semiconductor substrate 1. The lower plug 5 is laterally isolated from the digit line 3. The lower plug 5 is connected to source/drain regions of a MOS transistor (not shown) formed in the semiconductor substrate 1.

A cell electrode 6 is disposed on the intermediate interlevel oxide film 4. The cell electrode 6 meets with an upward face of the lower plug 5 and then laterally extends to cover the digit line 3. The cell electrode 6 is insulated from the digit line 3 through the intermediate interlevel oxide film 4.

An MTJ structure 10 is disposed on the cell electrode 6. The MTJ structure 10 is aligned to overlap with the digit line 3. The MTJ structure is composed of a first magnetic layer 7, a tunnel barrier 8, and a second magnetic layer 9. The first magnetic layer 7 is fixed in the direction of the magnetization moment. However, the second magnetic layer 9 may be varied by an external electric field.

Moreover, an upper interlevel oxide film 11 covers the cell electrode 6 and the MTJ structure 10. An upper plug 12 penetrates the upper interlevel oxide film 11, which is connected to the MTJ structure 10. A bit line is interposed on the upper interlevel oxide film 11, crossing over the digit line 3. The bit line 13 is connected with the upper plug 12. The bit line 13 is aligned to overlap with the MTJ structure 10. In other words, the MTJ 10 structure is interposed between the digit line 3 and the bit line 13, which intersect with each other. Here, the MTJ structure is electrically connected to the bit line 13 but insulated from the digit line 3. The bit line 13, the MTJ structure 10, the cell electrode 6, and the lower plug 5 form a current path to read out a data bit.

A unit cell of the magnetic memory device is comprised of the MTJ structure 10, and the digit and bit lines 3 and 13. The digit line 3 is shared by pluralities of unit cells that are arranged in parallel, while the bit line 13 is shared by pluralities of unit cells that are arranged in parallel with the pluralities of the bit lines. In a cell array of the magnetic memory device, pluralities of the digit lines 3 are arranged in parallel along a direction and the pluralities of the bit lines 13 cross over the digit lines 3 in parallel.

The above-mentioned conventional magnetic memory device is programmed through an electric field as a vector sum of a first electric field induced by the digit line 3 and a second electric field induced by the bit line 13. Namely, the vector-summed electric field programs a data bit into a selective one among the pluralities of the MTJ structures 10 arranged in a second-dimensional pattern. When programming data according to the above conventional manner, the digit line 3, the MTJ structure 10, and the bit line 13 should be efficiently aligned or arranged.

However, it may be difficult to accomplish an efficient arrangement among the MTJ structure 10 and the digit and bit lines 3 and 13. For example, a way of arranging the MTJ structure 10 and the digit and bit lines 3 and 13 may be carried out such that after aligning the MTJ structure 10 to the digit line 3, the bit line 13 is aligned to the MTJ structure 10. Nevertheless, with the above conventional approach, there still may be difficulties in achieving an alignment among the MTJ structure 10 and the lines 3 and 13 because of a coupling effect which may occur between the MTJ structure 10 and the digit line 3 and between the bit line 13 and the MTJ structure 10. The above-mentioned alignment difficulty may result in deviations occurring among the unit cells arranged in second-dimensional patterns. Such alignment deviations may increase as the magnetic memory device become more highly integrated, which in turn may cause program disturbance such as the program failure of selected cells or data changes of deselected cells. Consequently, the above program disturbance may result in an increase in the defect rate of the magnetic memory device.

Thus, there is a need for a magnetic memory device which minimizes the occurrence of program disturbance and for a method of forming the same.

SUMMARY OF THE INVENTION

In accordance with an exemplary embodiment of the present invention, a magnetic memory device is provided. The magnetic memory device includes a common line; a first write-in diode, a readout diode and a second write-in diode being connected to the common line in parallel. The magnetic memory device further includes a magnetic tunnel junction structure connected to the readout diode, first and second write-in conductors disposed at both sides of the magnetic tunnel junction structure and connected to the first and second write-in diodes, respectively and a first write-in line, a readout line and a second write-in line, which are connected to the first write-in conductor, the magnetic tunnel injection structure, and the second write-in conductor, respectively.

In some exemplary embodiments of the present invention, the first write-in conductor applies an electric field of a first direction to the magnetic tunnel junction structure during a first programming mode, while the second write-in conductor applies an electric field of a second direction to the magnetic tunnel junction structure during a second programming mode. During this, the first direction is reverse to the second direction. In this case, forward output terminals of the readout, first, and second write-in diodes are connected to the common line, while forward input terminals of the readout, first, and second write-in diodes are each connected to the magnetic tunnel junction structure, and the first and second write-in conductors. Otherwise, the forward input terminals of the readout, first, and second write-in diodes are connected to the common line, while the forward output terminals of the readout, first, and second write-in diodes are each connected to the magnetic tunnel junction structure, and the first and second write-in conductors.

According to an exemplary embodiment by the invention, a magnetic memory device is provided. The magnetic memory device includes a device isolation film confining an active region at a substrate doped with impurities of a first conductivity, a common line formed in the active region, being doped with impurities of a second conductivity, a first write-in semiconductor pattern, a readout semiconductor pattern and second write-in semiconductor pattern, which are disposed on the common line laterally separated from each other, and which are doped with impurities of the first conductivity. The magnetic memory device further includes a magnetic tunnel junction structure electrically connected to the readout semiconductor pattern and disposed on the readout semiconductor pattern, first and second write-in conductors each disposed on the first and second write-in semiconductor patterns at both sides of the magnetic tunnel junction structure, with the first and second write-in conductors each being electrically connected each to the first and second write-in semiconductor patterns, a readout line electrically connected to the magnetic tunnel junction structure, and first and second write-in lines each electrically connected to the first and second write-in conductors.

In accordance with another exemplary embodiment of the invention, a method of fabricating a magnetic memory device is provided. The method includes forming a device isolation film to confine an active region at a substrate doped with impurities of a first conductivity, forming a common line with impurities of a second conductivity in the active region, forming a first write-in semiconductor pattern, a readout semiconductor pattern and a second write-in semiconductor pattern, which are each disposed on the common line laterally separated from each other, and with each being doped with impurities of the first conductivity and forming a magnetic tunnel junction structure on the readout semiconductor pattern. The magnetic tunnel junction structure is electrically connected to the readout semiconductor pattern. The method further includes forming first and second write-in conductors each on the first and second write-in semiconductor patterns at both sides of the magnetic tunnel junction structure, such that the first and second write-in conductors are each electrically connected with the first and second write-in semiconductor patterns, forming a readout line which is electrically connected to the magnetic tunnel junction structure; and forming first and second write-in lines which are each electrically connected with the first and second write-in conductors.

BRIEF DESCRIPTION OF THE DRAWINGS

Exemplary Embodiments of the present invention can be understood in more detail from the following description taken in conjunction with the accompanying drawing, in which:

FIGS. 8 through 13 are sectional views illustrating processing steps to fabricate the magnetic memory device in accordance with an exemplary embodiment of the invention, taken along with the line I-I' of FIG. 4;

FIGS. 14A through 16A are sectional views illustrating processing steps to form diodes of the magnetic memory device in accordance with an exemplary embodiment of the invention, taken along with the line I-I' of FIG. 4; and FIGS. 14B through 16B are sectional views illustrating processing steps to form diodes of the magnetic memory device in accordance with an exemplary embodiment of the invention, taken along with the line II-II' of FIG. 4.

DETAILED DESCRIPTION OF EXEMPLARY EMBODIMENTS

Exemplary embodiments of the present invention will be described below in more detail with reference to the accompanying drawings. The present invention may, however, be embodied in different forms and should not be constructed as limited to the exemplary embodiments set forth herein.

Figure 1:
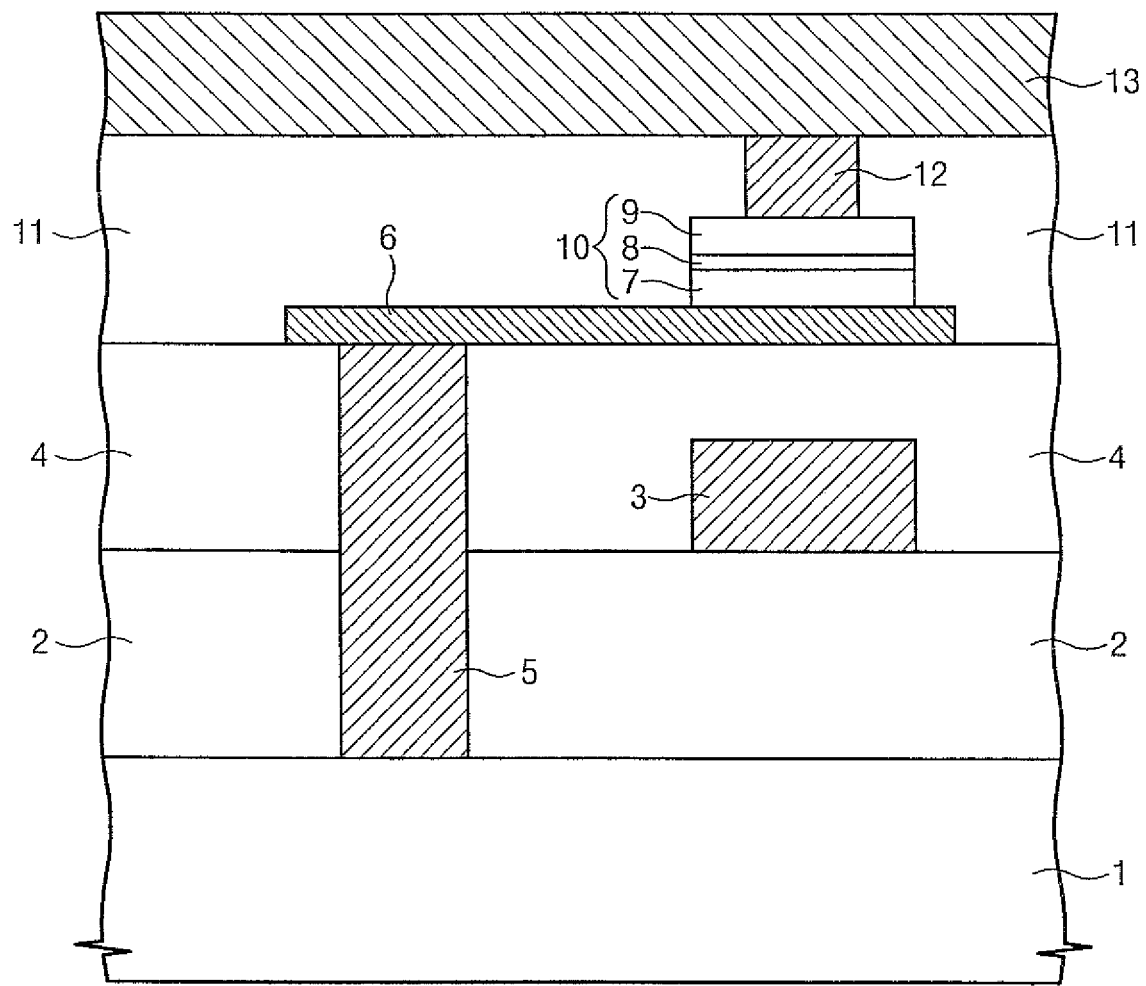
FIG. 1 is a sectional view showing a conventional magnetic memory device.
Figure 2A:
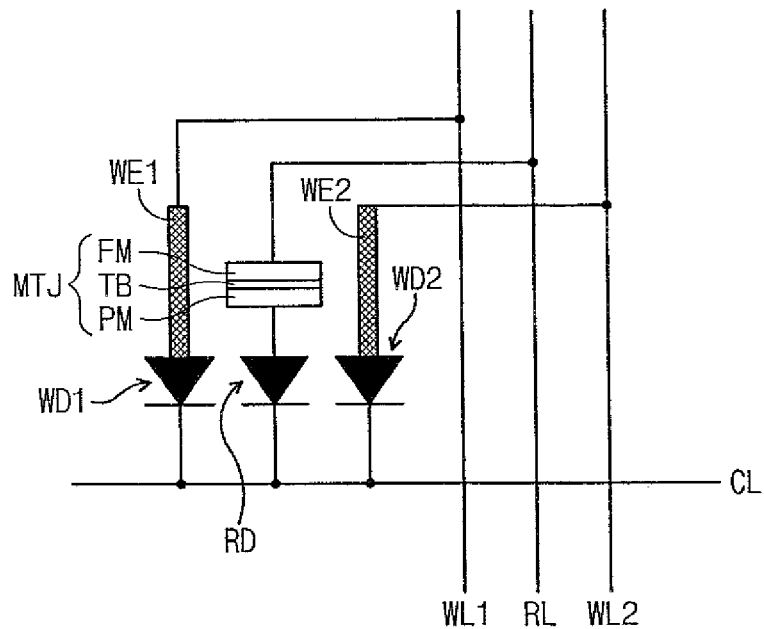
FIG. 2A is an electrically equivalent circuit illustrating an unit cell in accordance with an exemplary embodiment of the invention.
Figure 3:
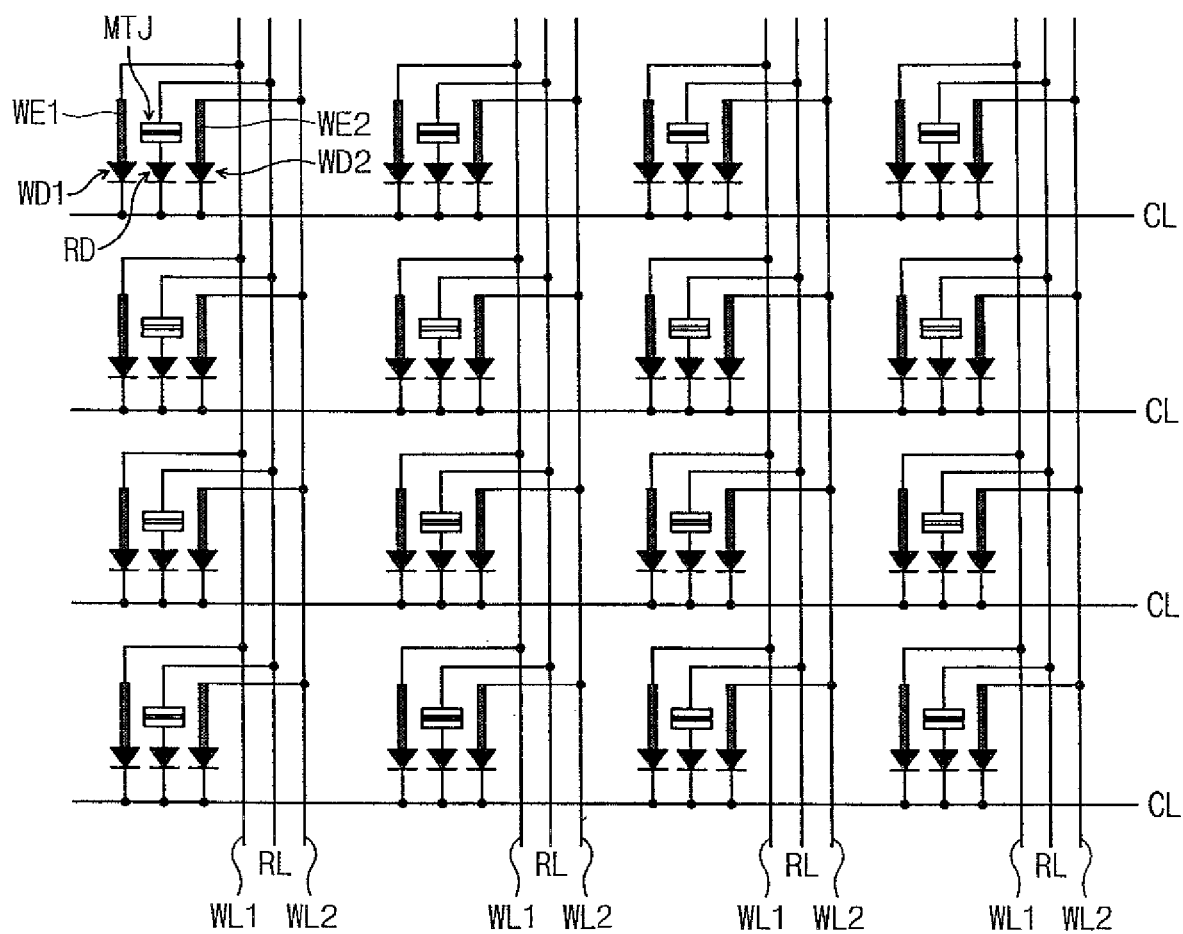
FIG. 3 is an electrically equivalent circuit illustrating a cell array with a plurality of the unit cell shown in FIG. 2A.

FIG. 2A is an electrically equivalent circuit illustrating a unit cell in accordance with an exemplary embodiment of the invention, and FIG. 3 is an electrically equivalent circuit illustrating a cell array with a plurality of the unit cell shown in FIG. 2A.

Referring to FIG. 2A, the unit cell includes a common line CL extending along a direction. A readout diode is connected to the common line CL. First and second write-in diodes WD1 and WD2 are disposed at both sides of the readout diode RD. The first and second write-in diodes WD1 and WD2 are electrically connected with the common line CL. The first write-in diode WD1, the readout diode RD, and the second write-in diode WD2 are connected in parallel with the common line CL.

A magnetic tunnel junction (MTJ) structure is electrically connected to an end of the readout diode RD. First and second write-in conductors WE1 and WE2 are disposed at both sides of the MTJ structure. Here, the first and second write-in conductors WE1 and WE2 are electrically connected to ends of the first and second write-in diodes WD1 and WD2, respectively. In other words, the readout diode RD and the MTJ structure are connected in series from the common line CL. The first write-in diode and conductor WD1 and WE1 are also connected in series from the common line CL and disposed at a side of the readout diode RD. In addition, the second write-in diode and conductor WD2 and WE2 are also connected in series from the common line CL and disposed at the other side of the readout diode RD.

Each of the diodes RD, WD1, and WD2 has forward input and output terminals. The forward input terminal is defined as a port through which a current flows into the diode when a forward bias voltage is applied to the diode, while the forward output terminal is defined as a port from which a current flows out of the diode when a forward bias voltage is applied to the diode. Thus, if currents are input through the forward input terminals of the diodes RD, WD1 and WD2, these currents flow smoothly through the diodes RD, WD1 and WD2. To the contrary, if currents are input through the forward output terminals of the diodes RD, WD1 and WD2, these currents do not flow through the diodes RD, WD1 and WD2.

As illustrated in FIG. 2A, the forward output terminals of the diodes RD, WD1, and WD2 may be connected with the common line CL in parallel. In this case, the MTJ structure is connected to the forward input terminal of the readout diode RD, while the first and second write-in conductors WE1 and WE2 are connected to the forward input terminals of the first and second write-in diodes WD1 and WD2, respectively.

A readout line RL is electrically connected to the MTJ structure, while first and second write-in lines WL1 and WL2 are electrically connected each to the first and second write-in conductors WE1 and WE2, respectively. The readout line RL, and the first and second write-in lines WL1 and WL2 may cross over the common line CL in parallel. The readout line RL, and the first and second write-in lines WL1 and WL2 are connected in series to the MTJ structure, and the first and second write-in conductors WE1 and WE2, respectively.

The MTJ structure is composed of a first magnetic layer PM with a fixed magnetization direction, a second magnetic layer FM with a changeable magnetization direction, and a tunnel barrier layer TB interposed between the first and second magnetic layers PM and FM. The magnetization direction of the first magnetic layer PM is fixed on a direction during a programming operation, while the magnetization direction of the second magnetic layer FM may be varied or changed during the programming operation. The magnetization direction of the second magnetic layer FM, which has been varied during the programming operation, may be maintained without change in a reading operation. The resistance value of the MTJ structure when the magnetization directions of the first and second magnetic layers PM and FM are the same may be the resistance value of the MTJ structure when the magnetization directions of the first and second magnetic layers PM and FM are the reverse.

As also illustrated in FIG. 2A, the first magnetic layer PM may be connected to the readout diode RD, while the second magnetic layer FM is connected to the readout line RL. Otherwise, the first magnetic layer PM may be connected to the readout line RL, while the second magnetic layer FM is connected to the readout diode RD.

A second-dimensional arrangement with the magnetic memory cells aforementioned is shown in FIG. 3.

Referring to FIG. 3, a plurality of magnetic memory cells are arranged in the second dimension along rows and columns. The magnetic memory cells arranged along each row are connected to a common line CL. A plurality of the common lines CL are arranged in parallel along the rows. The magnetic memory cells arranged along each column are connected to a first write-in line WL1, a readout line RL, and a second write-in lines WL2. The readout line RL, and the first and second write-in lines WL1 and WL2 are referred to as a cell line set. A plurality of the cell line sets are arranged in parallel along the columns.

The programming operation of the magnetic memory device including the unit cells and the cell array will now be discussed in more detail.

Referring to FIGS. 2A and 3, the programming operation in the magnetic memory device may be divisionally carried out through first and second programming modes. One of the first and second programming modes is to turn the resistance value of the MJT structure to be lower, while the other of the first and second programming modes is to turn the resistance value of the MJT structure to be higher.

During the first programming mode, the first write-in conductor WE1 applies an electric field of a first direction (hereinafter, first-directional electric field) to the MJT structure. It is preferred for the second write-in conductor WE2 not to generate an electric field during the first programming mode. During the second programming mode, the second write-in conductor WE2 applies an electric field of a second direction hereinafter, second-directional electric field) to the MJT structure. It is preferred for the first write-in conductor WE1 not to generate an electric field during the second programming mode. At this point, the first direction is reverse to the second direction. The magnetization direction of the first magnetic layer PM is fixed to one of the first and second directions.

The first programming mode will now be described in more detail. A first write-in voltage is applied to the first write-in line WL1 connected to a selected magnetic memory cell. A first common voltage is applied to the common line CL connected to the selected cell. The first write-in voltage is higher than the first common voltage. According to these bias conditions, a forward voltage is set on the first write-in diode WD1 in the selected cell, so that a first write-in current flows through the first write-in diode WD1. By the action of the first write-in current, the first-directional electric field is applied to the MTJ structure in the selected cell. As a result, the magnetization direction of the second magnetic layer FM in the MTJ structure can be arranged in the first direction.

During the first programming mode, it is preferable that the readout line RL and the second write-in line WL2 connected to the selected cell are supplied with a voltage equal to or lower than the first common voltage. Accordingly, to both ends of the readout diode RD and the second write-in diode WD2, the same or a reverse voltage is applied to make the readout diode RD and the second write-in diodes WD2 turn off. As a result, there is no current flow through the MTJ structure and the second write-in conductor WE2, such that the progress of the first programming mode is not affected. In addition, it is preferable to apply a voltage equal to or lower than the first common voltage to the deselected readout lines RL, and the deselected first and second write-in lines WL1 and WL2. The deselected common lines CL are preferably supplied with a voltage equal to or higher than the first write-in voltage. Thus, the diodes, RD, WD1, and WD2, of the deselected cells are turned off.

Next, the second programming mode will now be described in more detail as follows. For example, a second write-in voltage is applied to the second write-in line WL2 connected in a selected cell, while a second common voltage is applied to the common lines CL connected to the selected cell. The second write-in voltage is higher than the second common voltage. According to these bias conditions, a forward voltage is set on the second write-in diode WD2 in the selected cell, which makes a second write-in current flow through the second write-in diode WD2. The second write-in current flows in the same direction with the first write-in current. By the flow of the second write-in current, the second-directional electric field is applied to the MTJ structure of the selected cell. As a result, the magnetization direction of the second magnetic layer FM in the MTJ structure can be arranged in the second direction.

During the second programming mode, it is preferable that the readout line RL and the first write-in line WL1 connected to the selected cell are supplied with a voltage equal to or lower than the second common voltage. In addition, it is preferable to apply a voltage equal to or lower than the second common voltage to the deselected readout lines RL, and the deselected first and second write-in lines WL1 and WL2. The deselected common lines CL are preferably supplied with a voltage equal to or higher than the second write-in voltage.

As stated above, the first and second write-in conductors WE1 and WE2 are each disposed at both sides of the MTJ structure. Thus, the first and second write-in currents flowing in the same direction are able to supply the MTJ structure with the first-directional electric field or the second-directional electric field that is reverse to the first-directional electric field.

Now, the reading operation for the magnetic memory cell will now be described in more detail. For example, a readout voltage is applied to the readout line RL connected to a selected cell, while a third common voltage is applied to the common line CL connected to the selected cell. The readout voltage is preferably higher than the third common voltage. According to these bias conditions, a forward voltage is set on the readout diode RD in the selected cell, which makes a readout current flow through the readout diode RD in the selected cell. Data may be read out from the MTJ by sensing variation rates of the readout current or/and voltage along the resistance of the MTJ structure.

During the reading operation, it is preferable that the first and second write-in lines WL1 and WL2 in the selected cell are supplied with a voltage equal to or lower than the third common voltage. In addition, it is preferable to apply a voltage equal to or lower than the third common voltage to the deselected readout lines RL, and the deselected first and second write-in lines WL1 and WL2. The deselected common lines CL are preferably supplied with a voltage equal to or higher than the readout voltage.

One of the readout line RL and the common line CL is correspondent with a bit line, while the other is correspondent with a word line. In other words, the readout line RL may be the word line and the common line CL may be the bit line. To the contrary, the readout line RL may be the bit line and the common line CL may be the word line.

The magnetic memory cell of the present exemplary embodiment includes the first write-in conductor WE1, in which the first programming mode is executed only by means of the electric field generated from the first write-in conductor WE1. Further, the magnetic memory cell includes the second write-in conductor WE2, in which the second programming mode is executed only by means of the electric field generated from the second write-in conductor WE2. Namely, the magnetic memory cell of the present exemplary embodiment does not need a conventional vector-summed electric field for programming or a conventional alignment process. As a result, the magnetic memory device of the present exemplary embodiment may minimize program disturbance and provide high processing margin in manufacturing the magnetic memory cell in comparison to conventional magnetic memory devices and processes.

Moreover, in the present exemplary embodiment, the readout diode, and the first and second write-in diodes are connected to the common line CL through their forward output terminals. Otherwise, the forward input terminals of the diodes may be connected to the common line in parallel.

Figure 2B:
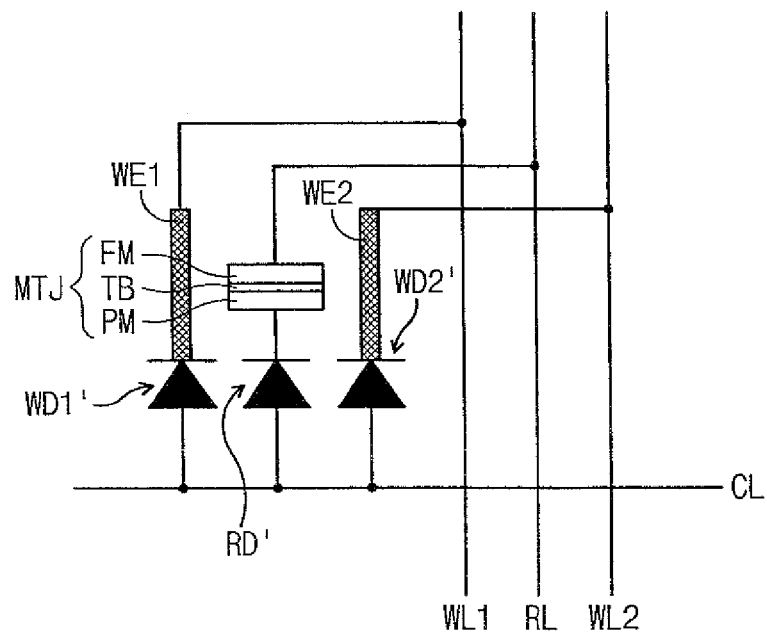
FIG. 2B is an electrically equivalent circuit illustrating a modification of the unit cell in accordance with an exemplary embodiment by the invention.

FIG. 2B is an electrically equivalent circuit illustrating a modification of the unit cell of the magnetic memory cell in accordance with an exemplary embodiment of the invention.

Referring to FIG. 2B, a readout diode RD', and first and second write-in diodes WD1' and WD2' are connected to a common line CL in parallel through their forward input terminals. The first write-in conductor WE1 is connected to the forward output terminal of the first write-in diode WD1', the MTJ structure is connected to the forward output terminal of the readout diode RD', and second write-in conductor WE1 is connected to the forward output terminal of the second write-in diode WD2'.

The reading and programming operations of the modified feature of the magnetic memory cell of the present exemplary embodiment of the invention will now be described in more detail. The programming operation with this modified cell is also divided into first and second programming modes.

First, referring to FIG. 2b, in the first programming mode, a first write-in voltage and a first common voltage are applied to the first write-in line WL1 and the common line CL, respectively. The first common voltage is higher than the first write-in voltage. Thus, a forward voltage is applied to the first write-in diode WD1', enabling a first write-in current to flow through the first write-in conductor WE1 connected to the first write-in diode WD1'. The first write-in current makes the first-directional electric field set around the MTJ structure.

During the first programming mode, it is preferable to supply the readout line RL and the second write-in line WL2 with a voltage equal to or higher than the first common voltage. Consequently, the readout diode RD' and the second write-in diode WD2' are turned off. In the configuration with a cell array composed of the magnetic memory cells having such diodes RD', WD1', and WD2', it is preferable to supply the deselected readout lines, and the deselected first and second write-in lines with the voltage equal to or higher than the first common voltage. The deselected common lines are preferably supplied with a voltage equal to or lower than the first write-in voltage. Thus, the diodes RD', WD1', and WD2' included in the deselected cells are turned off.

In the second programming mode, a second write-in voltage and a second common voltage are applied to the second write-in line WL2 and the common line CL, respectively. The second common voltage is higher than the second write-in voltage. Thus, a forward voltage is applied to the second write-in diode WD2', enabling a second write-in current to flow through the second write-in conductor WE2 connected to the second write-in diode WD2'. The second write-in current makes the second-directional electric field set around the MTJ structure. The first and second directions of the electric fields generated by the first and second write-in conductors WE1 and WE2 are reverse to each other.

During the second programming mode, it is preferable to supply the readout line RL and the first write-in line WL1 with a voltage equal to or higher than the second common voltage. Consequently, the readout diode RD' and the first write-in diode WD1'0 are turned off. In the configuration with a cell array composed of the magnetic memory cells having such diodes RD', WD1', and WD2', it is preferable to supply the deselected readout lines, and the deselected first and second write-in lines with the voltage equal to or higher than the second common voltage. The deselected common lines are preferably supplied with a voltage equal to or lower than the second write-in voltage. Thus, the diodes RD', WD1', and WD2' included in the deselected cells are turned off.

In the reading operation for the magnetic memory cell shown in FIG. 2B, a readout voltage is applied to the readout line RL, while a third common voltage higher than the readout voltage is applied to the common line CL. According to these bias conditions, a forward voltage is set on the readout diode RD', enabling data to be read out from the MTJ structure. It is preferable that the first and second write-in lines WL1 and WL2 are supplied with a voltage equal to or higher than the third common voltage, turning the first and second write-in diodes WD1' and WD2' off. In the configuration of a cell array with the magnetic memory cells as shown in FIG. 2B, it is preferable to apply a voltage equal to or higher than the third common voltage to the deselected readout lines, and the deselected first and second write-in lines. The deselected common lines are preferably supplied with a voltage equal to or lower than the readout voltage. Thus, the diodes RD', WD1', and WD2' of the deselected cells are turned off.

Moreover, from the directional difference between the first and second write-in diodes WD1 and WD2 of FIG. 2A and the first and second WD1' and WD2' of FIG. 2B, the write-in currents of the write-in conductors WE1 and WE2 shown in FIG. 2A flow in the direction reverse to those of the write-in conductors shown in FIG. 2B. Therefore, the first and second-directional electric fields described relevant to FIG. 2A are reverse to those described relevant to FIG. 2B.

Figure 4:
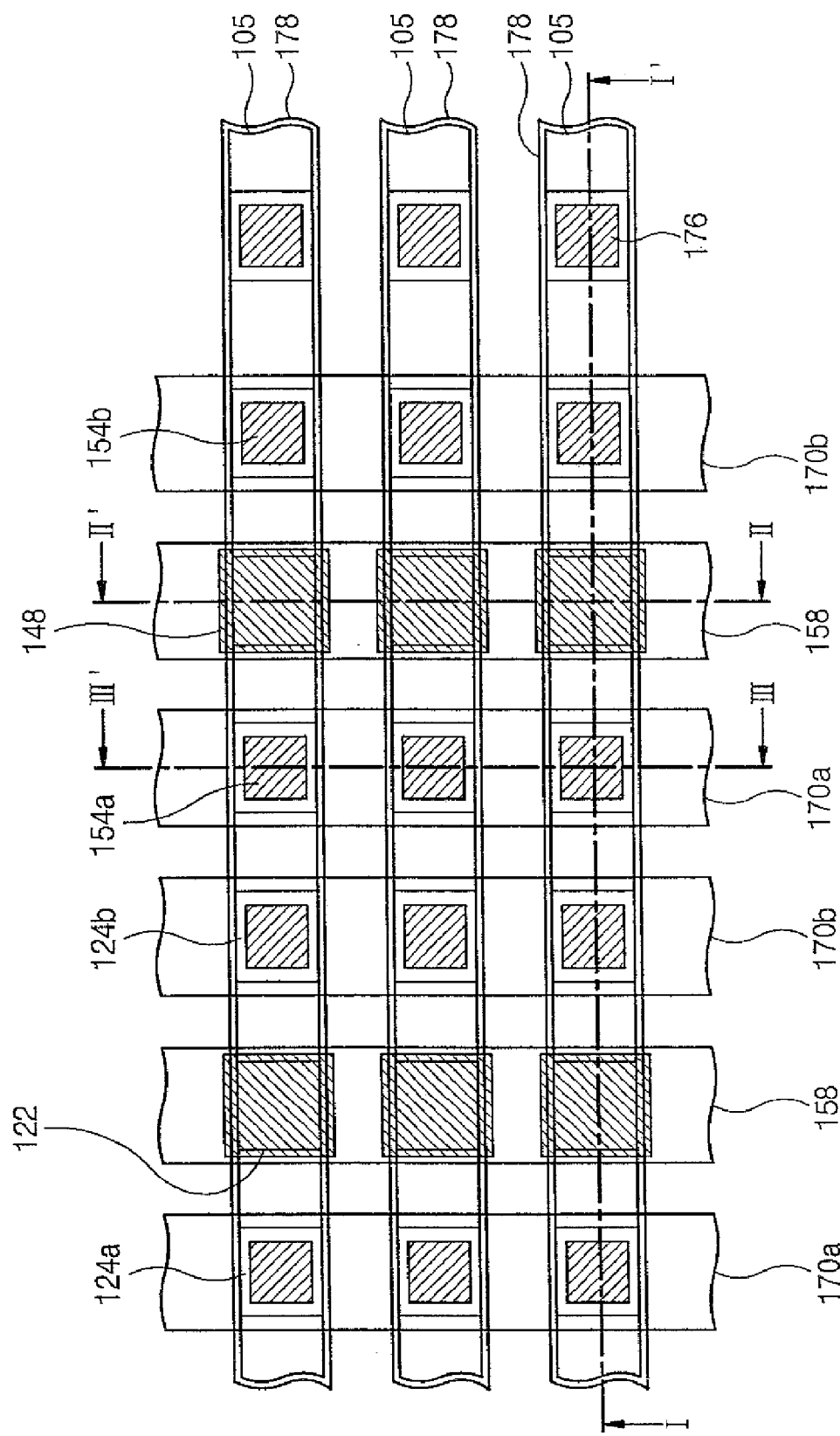
FIG. 4 is a plan view illustrating a layout pattern of the magnetic memory device in accordance with an exemplary embodiment by the invention.
Figure 5:
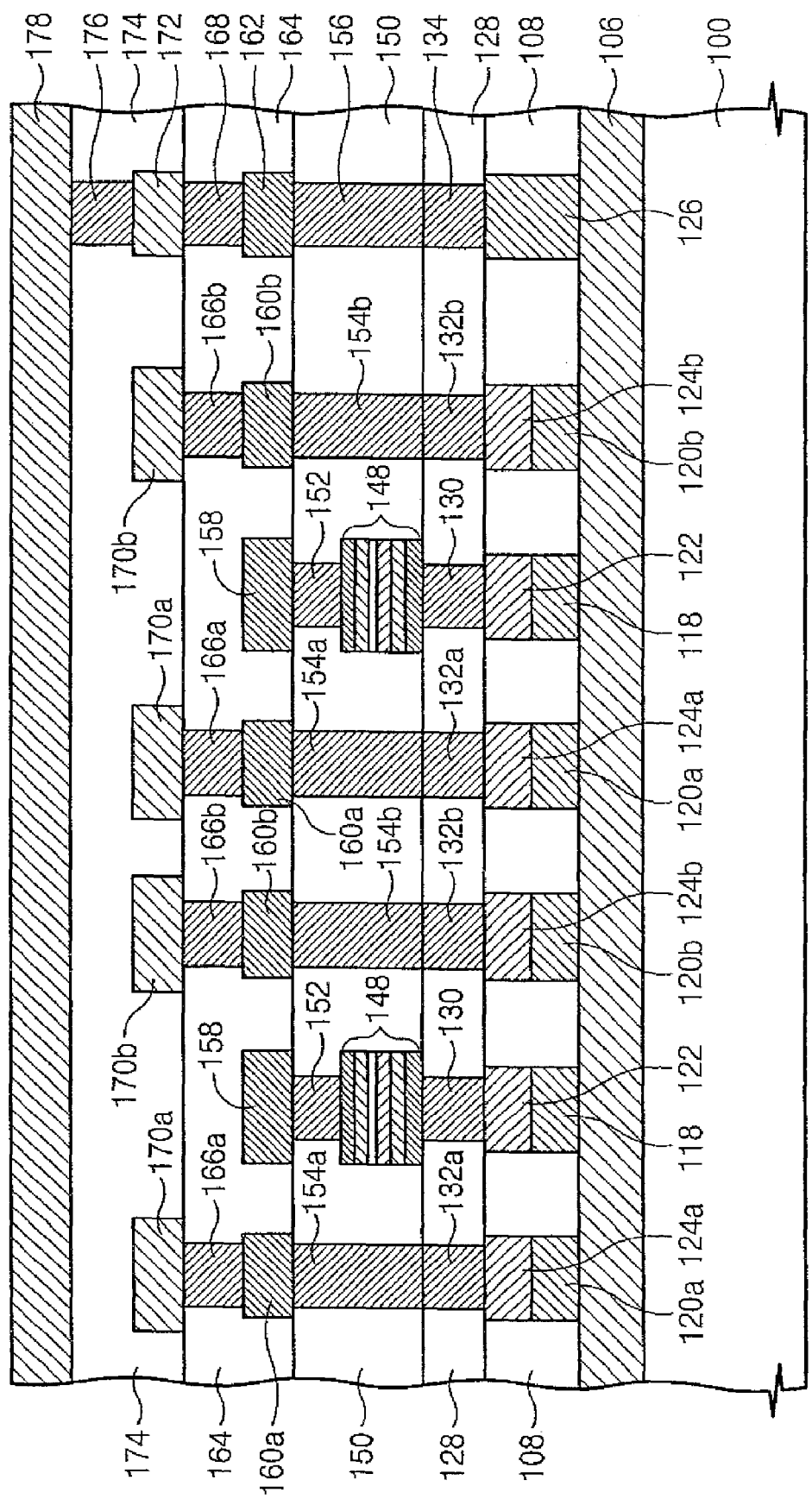
FIG. 5 is a sectional view taken along with the line I-I' of FIG. 4.
Figure 6:
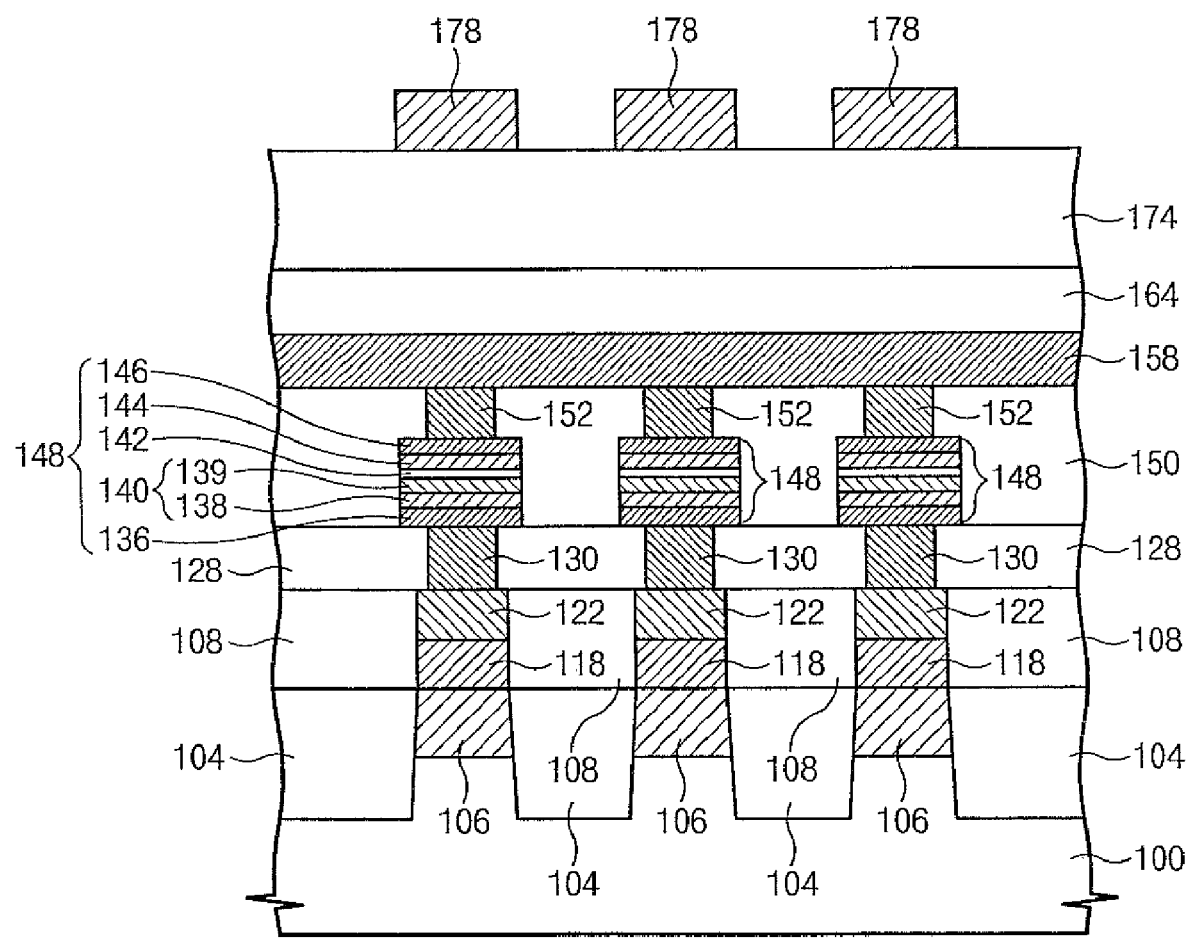
FIG. 6 is a sectional view taken along with the line II-II' of FIG. 4.
Figure 7:
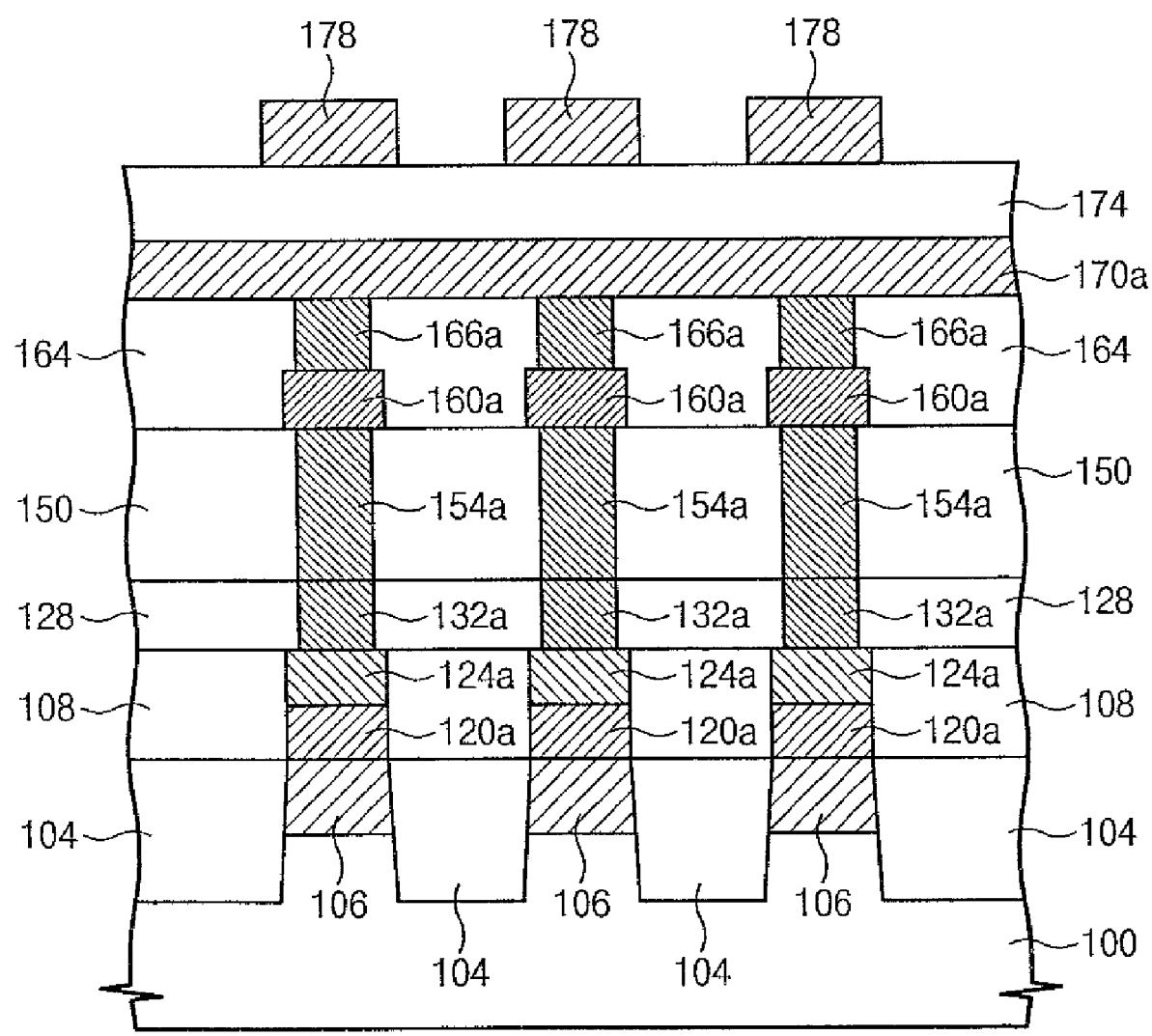
FIG. 7 is a sectional view taken along with the line III-III' of FIG. 4.

FIG. 4 is a plan view illustrating a layout pattern of the magnetic memory device in accordance with an exemplary embodiment by the invention, and FIGS. 5, 6, and 7 are sectional views taken along with the lines I-I', II-II', and III-III' of FIG. 4.

Referring to FIGS. 4, 5, 6, and 7, device isolation films 104 are formed to confine active regions 105 in a semiconductor substrate 100. The active regions 105 are defined in the pattern of lines extending along a direction. On the substrate 100, pluralities of the lineal active regions 105 are arranged in parallel with each other on the substrate 100.

In the active regions 105, common lines 106 doped with second-conductivity impurities are disposed extending along the active regions 105. The common lines 106 are correspondent with the common lines CL shown in FIGS. 2A and 2B. On the substrate 100, pluralities of the common lines 106 are arranged in parallel along the direction. The common lines 106 may be doped with a high impurity concentration to lower resistivity.

Readout semiconductor patterns 122 are disposed on the common lines 106. Additionally, first and second write-in semiconductor patterns 124a and 124b are each disposed at sides of the readout semiconductor pattern 122. On the common lines 106, the first write-in semiconductor patterns 124a, the readout semiconductor patterns 122, and the second write-in semiconductor pattern 124b are disposed in sequence. The readout semiconductor patterns 122, and the first and second write-in semiconductor patterns 124a and 124b are separated from each other. The readout semiconductor patterns 122, and the first and second write-in semiconductor patterns 124a and 124b are doped with impurities of the first-conductivity. The semiconductor patterns, 122, 124a, and 124b, may be doped in a high concentration so as to reduce the resistivity thereof. The readout semiconductor patterns 122, and the first and second write-in semiconductor patterns 124a and 124b constitute a group of cell semiconductor patterns. The plural cell semiconductor pattern groups may be disposed on one of the common lines 106, separated from each other.

One of the first and second-conductivity impurities may be, for example, an N-type impurity, while the other may be, for example, a P-type impurity.

The first write-in semiconductor pattern 124a and the common line 106 constitute the first write-in diode (WD1 or WD1'), the readout semiconductor pattern 122 and the common line 106 constitute the readout diode (RD or RD'), and the second write-in semiconductor pattern 124b and the common line 106 constitute the second write-in diode (WD2 or WD2').

When the first conductivity is the P-type and the second conductivity is the N-type, the readout semiconductor pattern 122, and the first and second semiconductor patterns 124a and 124b may constitute the first readout diode RD, and the first and second write-in diodes WD1 and WD2, shown in FIG. 2A, together with the common line 106. Otherwise, when the first conductivity is the N-type and the second conductivity is the P-type, the readout semiconductor pattern 122, and the first and second semiconductor patterns 124a and 124b may constitute the first readout diode RD', and the first and second write-in diodes WD1' and WD2', shown in FIG. 2B, together with the common line 106.

The readout semiconductor pattern 122, and the first and second semiconductor patterns 124a and 124b may contact the common line 106 directly. Otherwise, it may be constructed such that: the readout semiconductor pattern 123 and the common line 106 interpose a readout buffering pattern 118 therebetween, the first write-in semiconductor pattern 124a and the common line 106 interpose a first write-in buffering pattern 120a therebetween and the second write-in semiconductor pattern 124b and the common line 106 interpose a second write-in buffering pattern 120b therebetween. The buffering patterns, 118, 120a, and 120b, are made of semiconductors doped with the second-conductivity impurities. In this case, the buffering patterns, 118, 120a, and 120b, are preferably lower than the common line 106 in impurity concentration. With the presence of the lightly-doped buffering patterns 118, 120a, and 120b between the semiconductor patterns 122, 124a, and 124b and the common line 106, a leakage current may be minimized therein due to reverse voltage at the readout diode, and the first and second write-in diodes.

On the other hand, a predetermined region of the common line 106 may be a strapping region. This strapping region is provided to reduce resistance on the common line 106. Hereinafter the strapping region will now be described in more detail. The strapping region may be disposed at a side of a cell string that is composed of the plural cell semiconductor pattern groups arranged with equal distances.

A strapping semiconductor pattern 126 may be disposed on the strapping region. The strapping semiconductor pattern 126 is doped with second-conductivity impurities and is electrically connected to the common line 106. The strapping semiconductor pattern 126 may be made up with a high impurity concentration to reduce the resistivity therein.

A first insulation film 108 is formed on the substrate 100, covering the substrate surfaces around the semiconductor patterns 122, 124a, 124b, and 126. The upward face of the first insulation film 108 may be formed level with the upward faces of the semiconductor patterns 122, 124a, 124b, and 126. The first insulation film 108, as shown in the figures, may not cover the upward faces of the semiconductor patterns 122, 124a, 124b, and 126.

A buffering insulation film 128 may cover the first insulation film 108 and the upward faces of the semiconductor patterns 122, 124a, 124b, and 126. An MTJ structure 148 is disposed on the buffering insulation film 128. The MTJ structure 148 is located over the readout semiconductor pattern 122. Between the MTJ structure 148 and the readout semiconductor pattern 122 is interposed a lower readout plug 130 that penetrates the buffering insulation film 128. The MTJ structure 148 is electrically connected to the readout semiconductor pattern 122 by way of the lower readout plug 130. The MTJ structure 130 corresponds with the MTJ structure shown in FIGS. 2A or 2B.

Respectively, on the first write-in semiconductor pattern 124a, the second write-in semiconductor pattern 124b, and the strapping semiconductor pattern 126, a first lower write-in plug 132a, a second lower write-in plug 132b, and a first strapping plug 134 may each be disposed to penetrate the buffering insulation film 128. The first lower write-in plug 132a, the second lower write-in plug 132b, and the first strapping plug 134 are electrically connected to the the first write-in semiconductor pattern 124a, the second write-in semiconductor pattern 124b, and the strapping semiconductor pattern 126.

A second insulation film 150 covers the MTJ structure 148, the buffering insulation film 128, and the plugs 130, 132a, 132b, and 134. A first write-in conductor 154a penetrating the second insulation film 150 is disposed on the first write-in semiconductor pattern 124a, while a second write-in conductor 154b penetrating the second insulation film 150 is disposed on the second write-in semiconductor pattern 124b. The first and second write-in conductors 154a and 154b are electrically connected with the first and second write-in semiconductor patterns 124a and 124b, respectively. The first and second write-in conductors 154a and 154b may each be connected with the first and second lower write-in plugs 132a and 132b, electrically linking to the first and second write-in semiconductor patterns 124a and 124b, respectively. The first and second write-in conductors 154a and 154b are located at both sides of the MTJ structure 148. The first and second write-in conductors 154a and 154b are laterally separated from the MTJ structure 148. The first and second write-in conductors 154a and 154b may be formed in the shape of contact plugs, penetrating the second insulation film 150.

The first and second write-in conductors 154a and 154b are correspondent to the first and second write-in conductors WE1 and WE2 shown in FIG. 2A or 2B. Namely, the first write-in conductor 154a is used to supply the first-directional electric field to the MTJ structure 148 during the first programming mode, while the second write-in conductor 154b is used to supply the second-directional electric field to the MTJ structure 148 during the second programming mode. The first direction is reverse to the second direction. During the first programming mode, a forward voltage is applied to the first write-in diode to flow the first write-in current through the first write-in conductor 154a. During the second programming mode, a forward voltage is applied to the second write-in diode to flow the second write-in current through the second write-in conductor 154b.

On the strapping semiconductor pattern 126, a second strapping plug 156 is formed penetrating the second insulation film 150. The second strapping plug 156 is electrically connected to the common source line 106 by way of the first strapping plug 134 and the strapping semiconductor pattern 126. The strapping semiconductor pattern 126 may not be present therein. In this case, the first strapping plug 134 may extend downward to penetrate the first insulation film 108, directly contacting the common line 106. Without the strapping semiconductor pattern 126 and the buffering insulation film 128, the first strapping plug 134 may penetrate only the first insulation film 108 to contact the common line 106. Otherwise, the second strapping plug 156 may directly contact the strapping semiconductor pattern 126 or the common line 126 without the first strapping plug 134.

On the upward face of the MTJ structure 148, an upper readout plug 152 is disposed penetrating the second insulation film 150.

The buffering insulation film 128 and the plugs of the buffering insulation film 128, 130, 132a, 132b, and 134, may not be present therein. In this case, the MTJ structure 148 is directly connected to the upward face of the readout semiconductor pattern 122, while the first and second write-in conductors 154a and 154b are directly connected to the upward faces of the first and second write-in semiconductor patterns 124a and 124b. Further, the second strapping plug 156 directly contacts the upward face of the strapping semiconductor pattern 126.

Figure 16B:
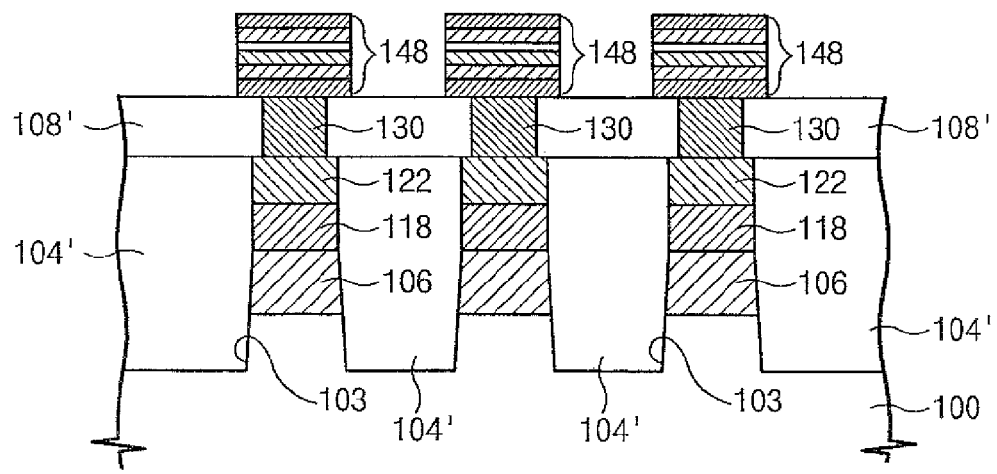
Figure 16A:
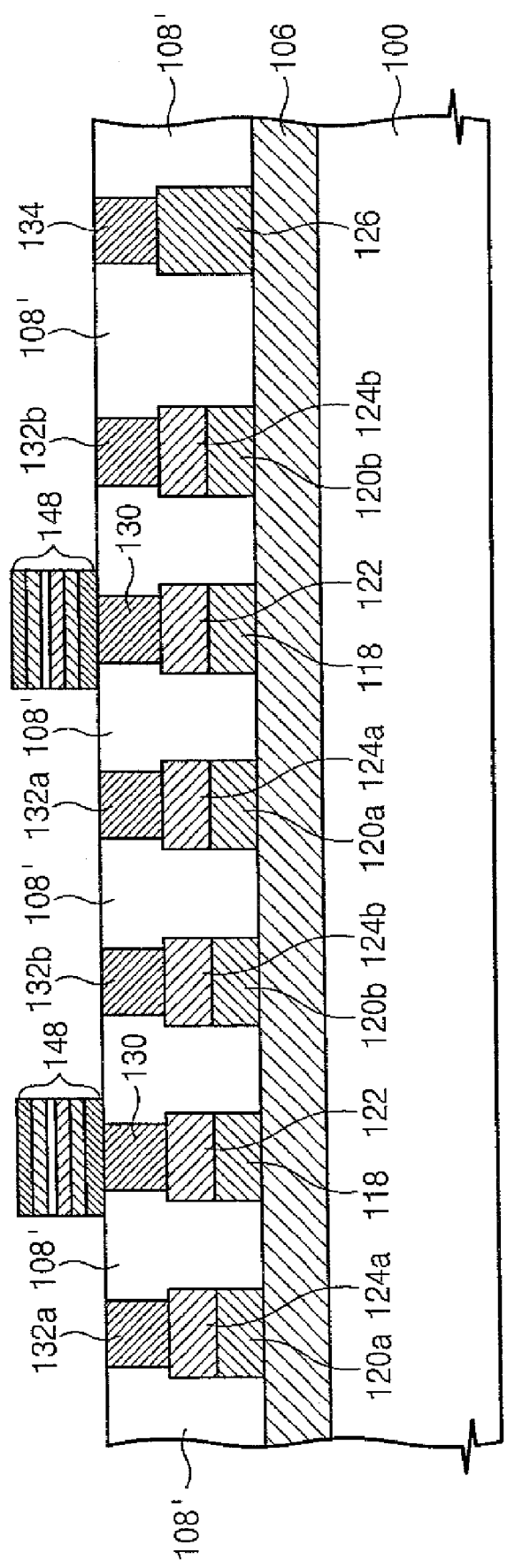

Meanwhile, along with the absence of the buffering insulation film 128, the first insulation film 108 may be modified to cover the semiconductor patterns 122, 124a, 124b, and 126, as shown in FIGS. 16A and 16B. The modified first insulating film is referred to by reference numeral 108'. In this case, the lower readout plug 130, the first lower write-in plug 132a, the second lower write-in plug 132b, and the first strapping plug 134 penetrate the first insulation film (108' of FIG. 16A) that is covering the semiconductor patterns 122, 124a, 124b, and 126. The device isolation films 104 may modified to extend upward, to partially cover the semiconductor patterns 122, 124a, 124b, and 126, such as, for example the device isolating films 104' shown in FIG. 16B.

The MTJ structure 148 includes a first magnetic layer 140 with the magnetization direction pinned in a direction, a second magnetic layer 144 with a variable magnetization direction, and a tunnel barrier layer 142 interposed between the first and second magnetic layers 140 and 144. The first magnetic layer 140 may include a pinning layer 138 and a pinned layer 139. The pinning layer 138 fixes the magnetization direction of the pinned layer 139 to a predetermined direction. The pinned layer 139 contacts the tunnel barrier layer 142. It is preferable for the magnetization direction of the first magnetic layer 140 to be fixed to one of the first and second directions. The magnetization direction in the second magnetic layer 144 is arranged along the first direction by the first-directional electric field generated from the first write-in conductor 154a during the first programming mode. Otherwise, the magnetization direction in the second magnetic layer 144 may be arranged along the second direction by the second-directional electric field generated from the second write-in conductor 154b during the second programming mode. In addition, it is preferable for the second magnetic layer 144 to retain its magnetization direction in the direction arranged by the first or second programming mode during the reading or/and standby operation.

The pinned layer 138 may be made up of, for example, an anti-ferromagnetic material. For instance, the pinned layer 138 is may be formed of, for example, ferrous manganese (FeMn), iridium manganese (IrMn), platinum manganese (PtMn), manganic oxide (MnO), manganic sulfide (MnS), manganic telluride (MnTe), manganic fluoride ($MnF_2$), ferrous fluoride ($FeF_2$), ferrous chloride ($FeCl_2$), ferrous oxide (FnO), cobaltic chloride ($CoCl_2$), nickel chloride ($NiCl_2$), nickel oxide (NiO), or chrome (Cr). The pinning layer 138 and the second magnetic layer 140 may be made up with, for example, a anti-ferromagnetic material containing iron, nickel, or cobalt, such as cobaltic iron (CoFe), nickel iron (NiFe), or cobaltic ferro-boride (CoFeB). The pinning layer 138 and the second magnetic layer 140 may be formed of the same ferromagnetic material or different ferromagnetic materials from each other. The tunnel barrier layer 142 may be formed of, for example, aluminum oxide or magnesium oxide.

The MTJ structure 148 may further include lower and upper electrodes 136 and 146. The lower and upper electrodes 136 and 146 may be formed of, for example, a conductive material with low reactivity, e.g., a conductive metal nitride such as titanium nitride or tantalum nitride. The lower electrode 136 contacts with the lower readout plug 136 or the readout semiconductor pattern 122, while the upper electrode 146 contacts the upper readout plug 152.

Moreover, the first magnetic layer 140 may contact the lower electrode 136 and the second magnetic layer 144 may contact the upper electrode 146. Namely, sequentially stacked on the substrate are the lower electrode 136, the pinning layer 138, the pinned layer 139, the tunnel barrier layer 142, the second magnetic layer 144, and the upper electrode 146. Otherwise, the second magnetic layer 144 may contact the lower electrode 136 and the first magnetic layer 140 may contact the upper electrode 146. Namely, sequentially stacked on the substrate 100 are the lower electrode 136, the second magnetic layer 144, the tunnel barrier layer 142, the pinned layer 139, the pinning layer 138, and the upper electrode 146.

Referring to FIGS. 4, 5, 6, and 7, a readout line 158 is arranged on the second insulation film 150, crossing the common line 106. The readout line 158 is connected with the upper readout plug 152, electrically linking to the MTJ structure 148. The readout line 158 may be connected to a plurality of MTJ structures 148 arranged along a column. The readout line 158 is correspondent with the readout line RD or RD' shown in FIG. 2A or 2B. The readout line 148 is formed of a conductive material. For instance, the readout line 148 may contain, for example, a metal such as tungsten, aluminum, or copper.

First and second landing patterns 160a and 160b may be disposed on the second insulation film 150, and may be connected to the first and second write-in conductors 154a and 154b. The first and second landing patterns 160a and 160b are located at both sides of the readout line 158, and are separate from each other. The first and second landing patterns 160a and 160b may be formed of the same material as the readout line 158. On the second insulation film 150, a first strapping landing pattern 162 may be connected to the second strapping plug 156. The first strapping landing pattern 162 may be also formed of the same material as the readout line 158.

A third insulation film 164 covers the readout pattern 158, the second insulation film 150, and the lading patterns 160a, 160b, and 162. The first and second write-in lines 170a and 170b are disposed on the third insulation film 164. The first and second write-in lines 170a and 170b cross over the common source line 106. The first and second write-in lines 170a and 170b are located at both sides of the readout line 158, being in parallel with the readout line 158. The first and second write-in lines 170a and 170b are correspondent with the first and second write-in lines WL1 and WL2 shown in FIG. 2A or 2B.

The first write-in line 170a is connected to a first upper write-in plug 166a that penetrates the third insulation film 164 and links with the first write-in landing pattern 160a. Namely, the first write-in line 170a is electrically connected to the first write-in conductor 154a by way of the first upper write-in plug 166a and the first write-in landing pattern 160a. The second write-in line 170b is connected to a second upper write-in plug 166b that penetrates the third insulation film 164 and links with the second write-in landing pattern 160b. Namely, the second write-in line 170b is electrically connected to the second write-in conductor 154b by way of the second upper write-in plug 166b and the second write-in landing pattern 160b. The first write-in line 170a is electrically connected to a plurality of the first write-in conductor 154a arranged along a column, while the second write-in line 170b is electrically connected to a plurality of the second write-in conductor 154b arranged along a column. The first and second write-in lines 170a and 170b are formed of a conductive material. For instance, the first and second write-in lines 170a and 170b may contain, for example, a metal such as tungsten, aluminum, or copper.

The first and second write-in lines 170a and 170b are formed higher than the third insulation film 164 that is covering the readout line 158, and thus the first and second write-in lines 170a and 170b are also formed higher than the readout line 158. Consequently, the first and second write-in lines 170a and 170b are isolated far from the MTJ structures 148 sharing the first and second write-in lines 170a and 170b in the magnetic memory cell. As a result, electric fields, which are generated from the first and second write-in lines 170a and 170b, are prevented from affecting the MTJ structures 148 of deselected cells during the programming operation.

Penetrating the third insulation film 164 on the first strapping landing pattern 162, a third strapping plug 168 may be connected to the first strapping landing pattern 162. On the third insulation film 164, a second strapping landing pattern 172 may be connected to the third strapping plug 168. The second strapping landing pattern 172 may be formed of the same material as the first and second write-in lines 170a and 170b.

A fourth insulation film 174 covers the third insulation film 164, the write-in lines 170a and 170b, and the second strapping landing pattern 172. On the fourth insulation film 174, a strapping line 178 is arranged such that it crosses the write-in lines 170a and 170b and the readout line 158. The strapping line 178 is disposed over the common line 106 in parallel therewith. The strapping line 178 is connected to a fourth strapping plug 176 that penetrates the fourth insulation film 174 to link with the second strapping landing pattern 172. Namely, the strapping line 178 is electrically connected to the common line 106. It is preferable for the strapping line 178 to be made up with a conductive material having a lower resistivity than that of the common line 106. For example, the strapping line 178 may contain, for example, a metal such as tungsten, copper, or aluminum. With the strapping line 178 voltage signals may be readily supplied to the common line 106 for the reading or programming operation.

One of the common line 106 and the readout line 158 is correspondent with the word line, while the other is correspondent with the bit line. In other words, one of the common line 106 and the readout line 158 may be led to a first selection decoder, while the other may be led to a second selection decoder and a sense amplifier.

An operational scheme for a magnetic memory device in accordance with the exemplary embodiments of the present invention depicted in FIGS. 2A, 2B, and 3 will now be described in more detail.

According to the magnetic memory device described above, it uses only the first-directional electric field, which is generated from the first write-in conductor 154a, during the first programming mode, while using only the second-directional electric field, which is generated from the second write-in conductor 154b, during the second programming mode.

Thus, program disturbance may be minimized and a processing margin may improve in manufacturing the device.

Further, the first and second write-in conductors 154a and 154b are located at both sides of the MTJ structure 148 in the form of contact plugs. Thus, the first and second write-in currents flow through the first and second write-in conductors 154a and 154b, being supplied vertically to a selected cell. As a result, the cell selectivity is significantly improved by the electric fields generated with the first and second write-in currents, so that the conventional program disturbance may be reduced. The cell selectivity may be defined, for example, by degrees of freedom in the MTJ structures of the deselected cells from the electric fields for programming data in the MTJ structure of the selected cell. In other words, improving the cell selectivity may mean, for example, that the electric field used for programming data in the selected cell has a decreased affect on the MTJ structures of the deselected cells.

In addition, the unit cell of the magnetic memory device each includes the first and second write-in conductors 154a and 154b. In other words, the unit cells do not share the first and second write-in conductors 154a and 154b. Thus, the first and second write-in conductors 154a and 154b are isolated relatively far from the adjacent MTJ structure 148. For instance, the distance between the write-in conductors 154a and 154b of a first unit cell and the MTJ structure of the first cell is shorter than that between the write-in conductors 154a and 154b of the first unit cell and the MTJ structure of a second cell adjacent to the first cell. As a result, the effect of the electric field, which is generated by the write-in conductors 154a and 154b, toward the MTJ structures 148 of the adjacent cells may be minimized. Therefore, the improved cell selectivity for the electric field by the write-in conductors 154a and 154b contributes to minimizing the program disturbance.

Moreover, the first and second write-in lines 170a and 170b are positioned higher than the readout line 158, so that they are isolated far from the MTJ structure 148 sharing them. As a result, the effect of electric field, which is generated by the write-in conductors 154a and 154b to which the write-in currents are applied, toward the MTJ structures 148 of the deselected cells may be minimized. Therefore, the program disturbance may be significantly reduced.

FIGS. 8 through 13 are sectional views illustrating processing steps to fabricate the magnetic memory device in accordance with an exemplary embodiment of the invention, taken along with the line I-I' of FIG. 4.

Referring to FIG. 8, the device isolation films are formed in the semiconductor substrate 100 of a first conductivity, confining the active regions 105 shown in FIG. 4. The device isolation films may be formed in trench types. The substrate 100 of the first conductivity may include a well doped with impurities of the first conductivity. The substrate 100 may be, for example, a silicon, germanium, or silicon-germanium substrate.

The common line 106 is formed in the active region by injecting impurities of the second conductivity. The common line 106 is formed in the pattern of lines. The common line may be formed after completing the device isolation films. Otherwise, the device isolation films may be formed after forming impurity-doped layers of the second conductivity in the substrate 100 of the second conductivity and forming trenches by sequentially patterning the impurity-doped layers and the substrate 100. Here, the patterned impurity-doped layers of the second conductivity are correspondent with the common line 106.

The first insulation film 108 is deposited on the overall structure of the substrate 100. The first insulation film 108 may be made of silicon oxide. Subsequently, the first insulation film 108 is patterned to form readout openings 110 and first and second write-in openings 112a and 112b which are each located at both sides of the readout openings 110. The readout openings 110, and the first and second write-in openings 112a and 112b are separated from each other, each partially exposing the common line 106. While forming the readout openings 110, and the first and second write-in openings 112a and 112b, a strapping opening 114 may be also formed to expose the strapping region.

Figure 10:
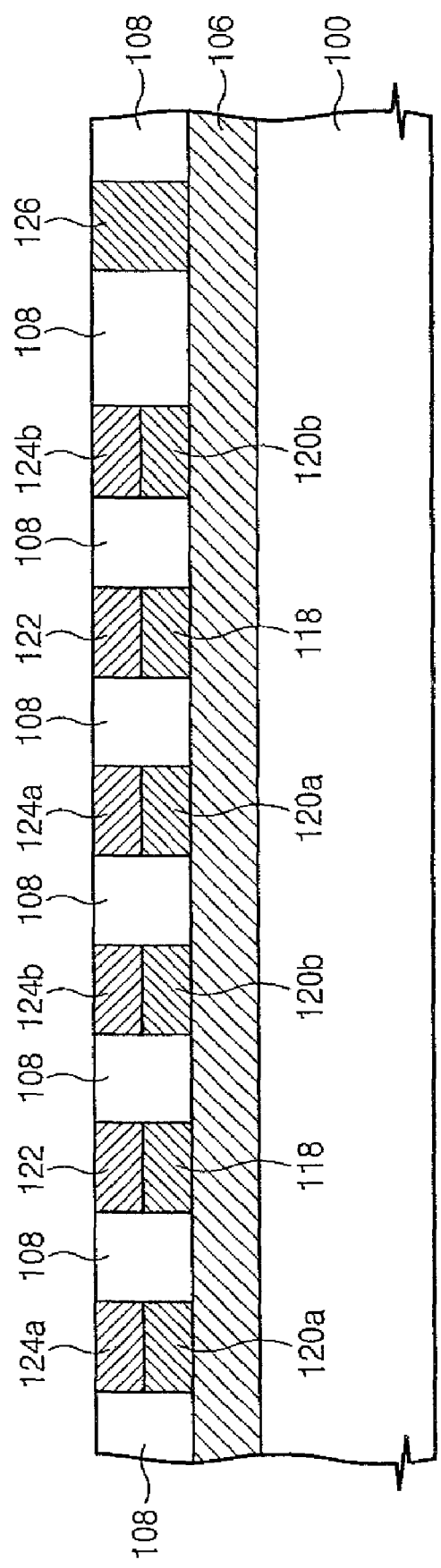

Referring to FIGS. 9 and 10, semiconductor layers 116 are formed in the openings 110, 112a, 113b, and 114. The semiconductor layers 116 are preferably formed by means of epitaxial growth. According to this, the semiconductor layers 116 may be formed of, for example, a single crystalline semiconductor.

Thereafter, the readout buffering patterns 118, and the first and second write-in buffering patterns 120a and 120b are each formed at lower portions of the semiconductor layers 116 that are positioned in the readout openings 110, and the first and second write-in openings 112a and 112b. The buffering patterns 118, and 120a and 120b are doped with impurities of the second conductivity. It is preferable for the buffering patterns 118, and 120a and 120b to be lower than the common line 106 in impurity concentration. In addition, the readout buffering patterns 122, and the first and second write-in semiconductor patterns 124a and 124b are each formed at upper portions of the semiconductor layers 116 that are positioned in the readout openings 110, and the first and second write-in openings 112a and 112b. The semiconductor patterns 122, 124a, and 124b are doped with impurities of the first conductivity.

The buffering patterns 118, 120a, and 120b are completed by selectively injecting ionic impurities into the lower portions of the semiconductor layers 116, while the semiconductor patterns 122, 124a, and 124b are completed by selectively injecting ionic impurities into the upper portions of the semiconductor layers 116.

An alternative method for forming the buffering patterns 118, 120a, and 120b and the semiconductor patterns 122, 124a, and 124b, will be now be described in more detail. First, impurities of the second conductivity are doped in-situ when the semiconductor layers 116 are growing up by means of the epitaxial growth. During this, the impurities of the second conductivity are controlled to be lower in concentration than the impurity concentration of the common line 106. Next, ionic impurities are injected into the upper portions of the semiconductor layers 116, forming the semiconductor patterns 122, 124a, and 124b. Here, the lower portions of the semiconductor layers 116 under the semiconductor patterns 122, 124a, and 124b are correspondent with the buffer patterns 118, 120a, and 120b.

Ionic impurities are injected into the semiconductor layer 116 of the strapping opening 114, forming the strapping semiconductor pattern 126. The impurity concentration of the strapping semiconductor pattern 126 may be adjusted near to that of the common line 106.

One of the first and second conductivities may be an N-type, while the other may be a P-type.

Figure 11:
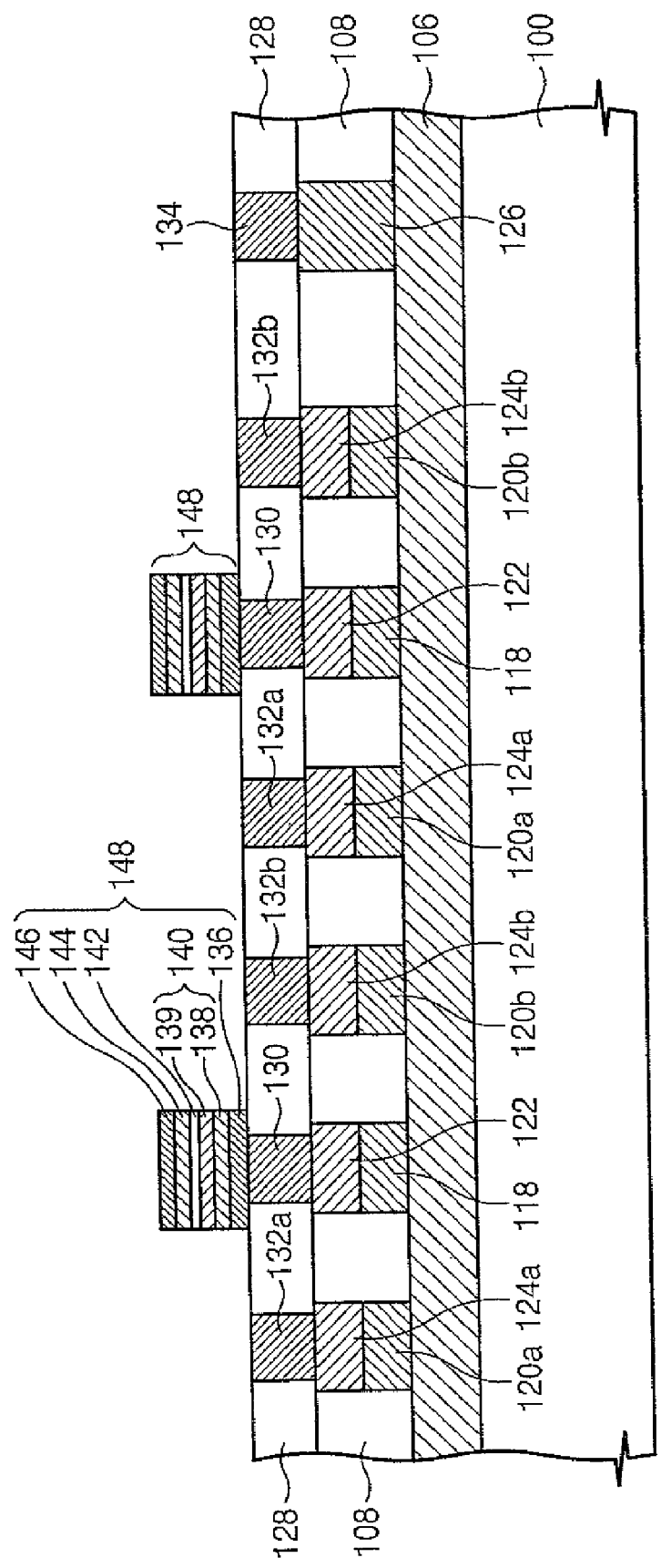

Referring to FIG. 11, the buffering insulation film 128 is deposited on the overall structure of the substrate 100. The buffering insulation film 128 may be formed of, for example, a silicon oxide. Next, the lower readout plug 130, the first and second lower write-in plugs 132a and 132b, and the first strapping plug 134 are formed to penetrate the buffering insulation film 128. The lower readout plug 130 is connected to the readout semiconductor pattern 122, while the first and second lower write-in plugs 132a and 132b are each connected to the first and second semiconductor patterns 124a and 124b. The first strapping plug 134 is connected to the strapping semiconductor pattern 126.

The plugs 130, 132a, 132b, and 134 are made up of conductive materials. For example, the plugs 130, 132a, 132b, and 134 may be formed of a metal such as tungsten, copper, or aluminum, a conductive metallic nitride such as titanium nitride or tantalum nitride, or a metallic silicide. The plugs 130, 132a, 132b, and 134 may contain, for example, a metallic silicide contacting with the semiconductor patterns 122, 124a, 124b, and 126.

The MTJ structures 148 are formed on the buffering insulation film 128. The MTJ structures 148 are each located over the readout semiconductor patterns 122, and each of the MTJ structures are connected to the lower readout plugs 130. The MTJ structures are electrically connected to the readout semiconductor patterns 122.

The MTJ structure 148 may include the lower electrode 136, the first magnetic layer 140, the tunnel barrier layer 142, the second magnetic layer 144, and the upper electrode 146 stacked in sequence. The first magnetic layer 140 includes the pinning layer 138 and the pinned layer 139 stacked in sequence. Alternatively, the MTJ structure 148 may be substituted with the first and second magnetic layers 140 and 144 in position. Namely, the MTJ structure 148 may include the lower electrode 136, the second magnetic layer 144, the tunnel barrier layer 142, the first magnetic layer 140, and the upper electrode 146 stacked in sequence. In this case, the first magnetic layer 140 includes the pinned layer 139 and the pinning layer 138 stacked in sequence.

The characteristics and materials of the lower electrode 136, the first magnetic layer 140, the tunnel barrier layer 142, the second magnetic layer 144, and the upper electrode 146 of the present exemplary embodiment are the same as in the exemplary embodiment depicted in FIGS. 4 through 7.

The processing steps of forming the buffering insulation film 128 and the plugs 130, 132a, 132b, and 134 may be omitted. In this case, the MTJ structures 148 directly contact the readout semiconductor patterns 122. During this, the lower electrode 136 may further contain, for example, a metal silicide contacting the readout semiconductor pattern 122.

Figure 12:
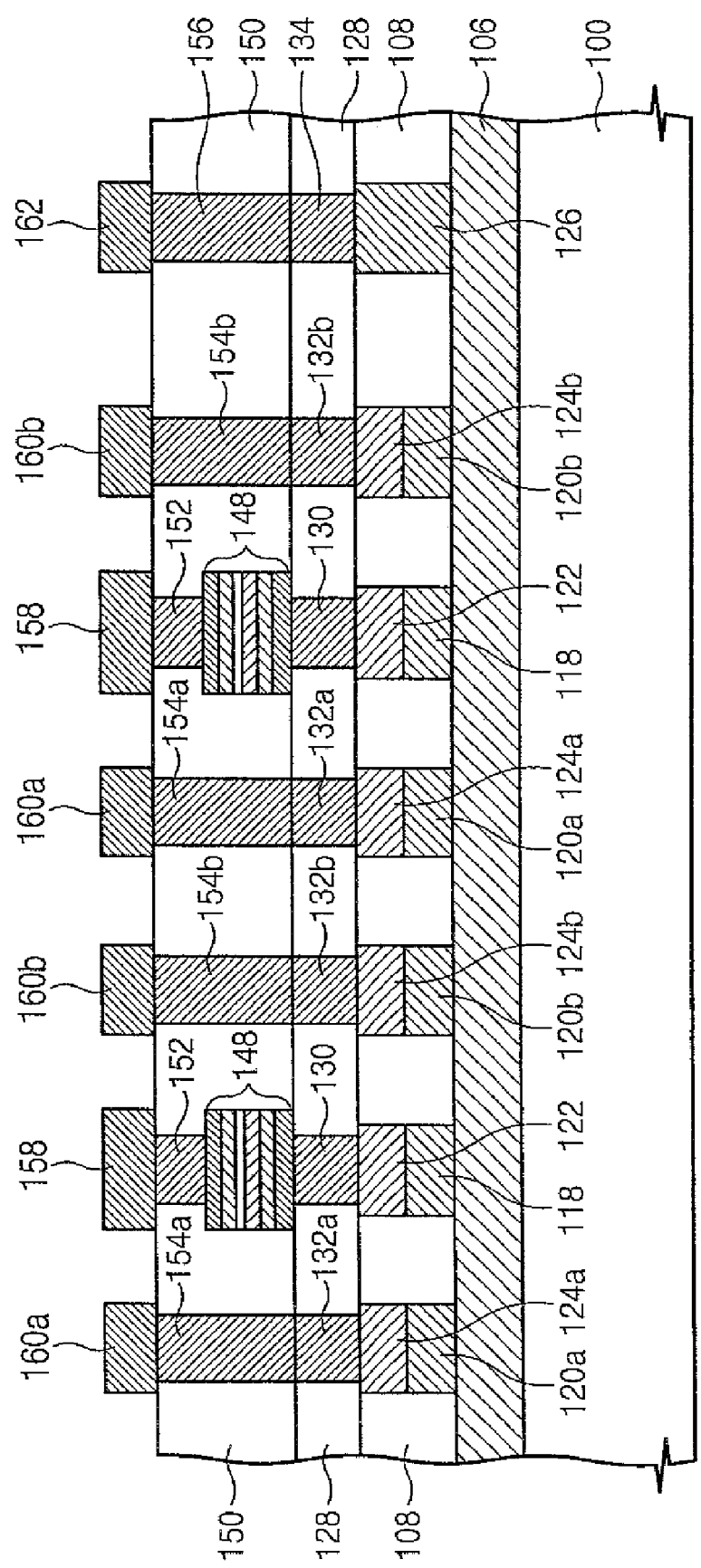

Referring to FIG. 12, the second insulation film 150 is deposited on the overall structure of the substrate 100. The second insulation film 150 may be formed of, for example, a silicon oxide. Next, the upper readout plug 152, the first and second write-in conductor 154a and 154b, and the second strapping plug 156 are formed penetrating the second insulation film 150.

The first and second write-in conductors 154a and 154b are disposed at both sides of the MTJ structure 148. The first and second write-in conductors 154a and 154b are each connected to the first and second lower plugs 132a and 132b, and electrically lead to the first and second write-in semiconductor patterns 124a and 124b, respectively. The first and second write-in conductors 154a and 154b are formed in the pattern of contact plugs. The upper readout plug 152 is connected to the upward face of the MTJ structure 148. The second strapping plug 156 is connected to the first strapping plug 134, and electrically leads to the common line 106.

The first and second write-in conductors 154a and 154b are formed of, for example, a metal such as tungsten, copper, or aluminum, a conductive metallic nitride such as titanium nitride or tantalum nitride, or a metallic silicide. The upper readout plug 152 and the second strapping plug 156 may be made up of the same material as the first and second write-in conductors 154a and 154b.

Without the buffering insulation film 128 and the plugs 130, 132a, 132b, and 134 in the buffer insulation film 28, the first and second write-in conductors 154a and 154b and the second strapping plug 156 may contact directly with the first and second write-in semiconductor patterns 124a and 124b, and the strapping semiconductor pattern 126, respectively. In this case, the first and second write-in conductors 154a and 154b and the second strapping plug 156 may contain, for example, a metal silicide contacting the semiconductor patterns 124a, 124b, and 126.

Subsequently, a first line conductive film is deposited on the second insulation film 150 and patterned to form the readout lines 158, which cross over the common lines 106, over the MTJ structures 148. The readout line 158 links with the upper readout plug 152, electrically connected to the MTJ structure 148. The readout line 158 may be formed of, for example, a metal such as tungsten, copper, or aluminum, a conductive metallic nitride such as titanium nitride or tantalum nitride, or a metallic silicide.

While patterning the first line conductive film, the first and second landing patterns 160a and 160b may further be formed on the first and second write-in conductors 154a and 154b. In addition hereto, during a step of patterning the first line conductive film, the first strapping landing pattern 162 may further be formed on the second strapping plug 156. The landing patterns, 160a, 160b, and 162, form parts of the first line conductive film and are made of the same material as the readout line 158.

Figure 13:
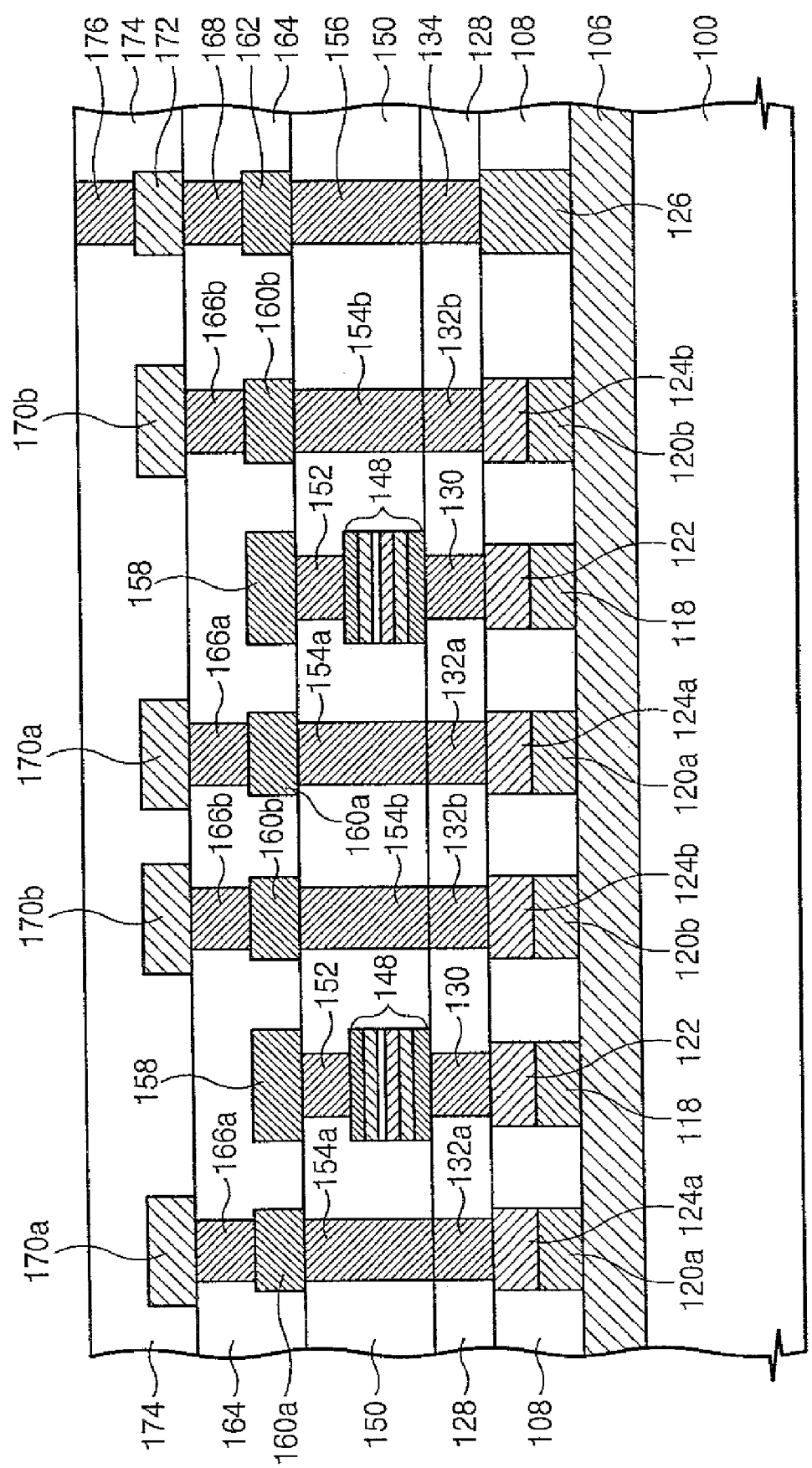

Referring to FIG. 13, the third insulation film 164 is deposited on the overall structure of the substrate 100. The third insulation film 164 may be formed of, for example, a silicon oxide. The third insulation film 164 can be flattened through, for example, a planarization process.

The first and second upper write-in plugs 166a and 166b and the third strapping plug 168 are each formed to penetrate the third insulating film 164. Moreover, the first and second upper write-in plugs 166a and 166b and the third strapping plug 168 are each connected with the first and second write-in landing patterns 160a and 160b, and the first strapping landing pattern 162, respectively. The plugs, 166a, 166b, and 162, may be formed of a metal such as, for example, tungsten, copper, or aluminum, a conductive metallic nitride such as titanium nitride or tantalum nitride, or a metallic silicide.

Thereafter, a second line conductive film is deposited on the third insulation film 164 and is patterned to form the first and second write-in lines 170a and 170b, which cross over the common lines 106 in parallel and are each connected to the first and second upper write-in plugs 166a and 166b. While patterning the second line conductive film, the second strapping landing pattern 172 may further be formed connected to the third strapping plug 168. The second strapping landing pattern 172, as part of the second line conductive film, is formed of the same material as the write-in lines 170a and 170b. The write-in lines 170a and 170b may be formed of, for example, a metal such as tungsten, copper, or aluminum, a conductive metallic nitride such as titanium nitride or tantalum nitride, or a metallic silicide.

The fourth insulation film 174 is deposited to entirely or at least substantially entirely cover the substrate 100. The fourth insulation film 174 may be flattened on its upward face. The fourth insulation film 174 may be formed of, for example, a silicon oxide. Subsequently, the fourth strapping plug 176 is formed penetrating the fourth insulation film 174, and connected to the second strapping landing pattern 172. The fourth strapping plug 176 may contain a conductive material such as, for example, a metal or/and conductive metallic nitride.

The strapping line 178 is formed on the fourth insulation film 174 as shown in FIG. 4, 5, 6, or 7. The strapping line 178 may be formed containing, for example, a metal or/and conductive metallic nitride.

The diodes including the semiconductor patterns 122, 124a, and 124b may be completed as described below.

FIGS. 14A through 16A are sectional views illustrating processing steps to form the diodes of the magnetic memory device in accordance with an exemplary embodiment of the invention, taken along with the line I-I' of FIG. 4, and FIGS. 14B through 16B are sectional views illustrating processing steps to form the diodes of the magnetic memory device in accordance with another exemplary embodiment of the invention, taken along with the line II-II' of FIG. 4.

Figure 14B:
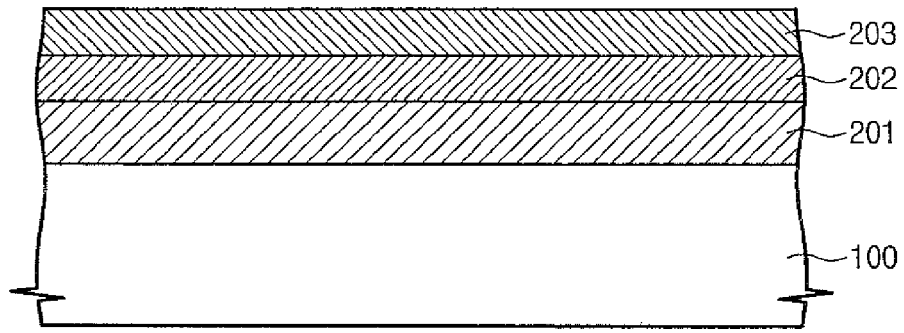

Referring to FIGS. 14A and 14B, ionic impurities of a second conductivity are injected into the substrate 100 of a first conductivity, forming a first doped layer 201 having a predetermined depth. Additionally, ionic impurities of the second conductivity are further injected into the substrate 100, forming a second doped layer 202 on the first doped layer 201 having a predetermined depth The second doped layer 202 is preferably lower than the first doped layer in impurity concentration.

Thereafter, ionic impurities of the first conductivity are further injected into the substrate 100, forming a third doped layer 203 on the second doped layer 202. In addition, ionic impurities of the second conductivity are still further injected into a predetermined region of the substrate 100, which includes the strapping region aforementioned with reference to FIGS. 4, 5, 6, or 7, forming a fourth doped layer 204. The ionic impurities of the first conductivity, which have been used for the third doped layer 203, may not be injected into the region of the fourth doped layer 204. The fourth doped layer 204 is positioned on the first doped layer 201. The fourth doped later 204 may be formed including the strapping region and the regions where the device isolation films are disposed at both sides of the strapping region. The third and fourth doped layers 203 and 204 may be formed level with the substrate 100.

Figure 15B:
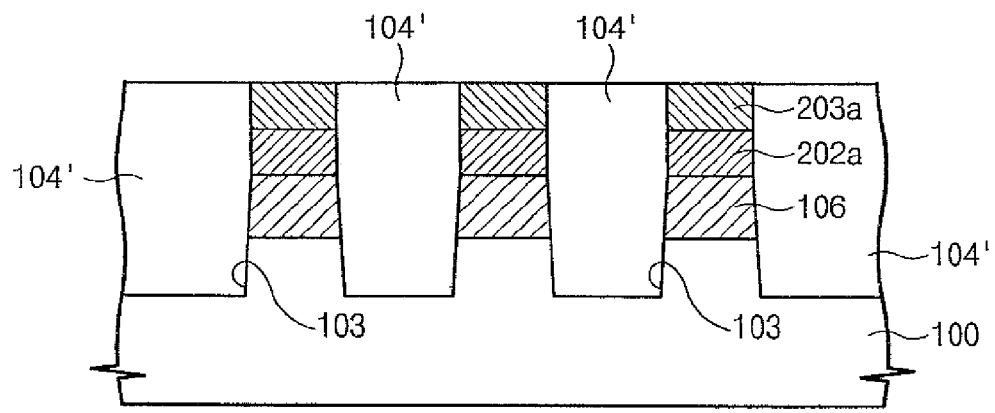

Next, referring to FIGS. 15A and 15B, the fourth, third, second, and first doped layers, 204, 203, 202, and 201, and the substrate 100, are patterned in sequence, to form trenches 103, which define the active regions 105, and the common lines 106 in the active regions 105. The common line 106 is formed as a part of the first doped layer 201.

In the active region 105, the patterned common line 106, a patterned second doped layer 202a, and a patterned third doped layer 203a are stacked in sequence. The patterned doped layers 202a and 203a are arranged in the form of lines. Also, a patterned fourth doped layer 204a is also disposed in a predetermined region of the common line 106.

Next, device isolation films 104' are formed filling up the trenches 103. The device isolation films 104' may cover both sides of the common line 106 and the patterned doped layers 202a, 203a, and 204a. The device isolation films 104' may be formed in the pattern of the former device isolation films 104 shown in FIGS. 6 and 7 by an additional processing step for recessing their upward faces.

Referring to FIGS. 16A and 16B, the patterned doped layers 203a and 202a, and 204a are further patterned to form the buffer patterns 120a, 118, and 120b, and the semiconductor patterns 124a, 122, and 124b.

On the common line 106, the readout buffering pattern 118, and the first and second write-in buffering patterns 120a and 120b are laterally arranged in sequence. The readout semiconductor pattern 122, and the first and second write-in semiconductor patterns 124a and 124b are each disposed on the readout buffering pattern 118, and the first and second write-in buffering patterns 120a and 120b. The strapping semiconductor pattern 126 is formed on the strapping region. The readout buffering pattern 118, and the first and second write-in buffering patterns 120a and 120b are formed as part of the patterned second doped layer 202a, while the readout semiconductor pattern 122, and the first and second write-in semiconductor patterns 124a and 124b are formed as part of the patterned third doped layer 203a. The strapping semiconductor pattern 126 is formed as a part of the patterned fourth doped layer 204a.

A first insulation film 108' is deposited on the overall structure of the substrate 100, covering the semiconductor patterns 122, 124a, 124b, and 126. Thereafter, the lower readout plug 130, the first and second lower write-in plugs 132a and 132b, and the first strapping plug 134 are each connected to the readout write-in semiconductor pattern 122, the first and second write-in semiconductor patterns 124a and 124b, and the strapping semiconductor pattern 126, thereby also penetrating the first insulation film 108'. The MTJ structure 148 is formed on the first insulation film 108' and is connected with the lower readout plug 130. The post-processing steps are carried out in the same manner as those methods aforementioned with reference to FIGS. 12 and 13.

Furthermore, the insulation film 108 shown in FIG. 10 may be formed by flattening the first insulation film 108' until the semiconductor patterns 122, 124a, 124b, and 126 are exposed. In this case, the post-processing steps are also carried out in the same manner as those methods aforementioned with reference to FIGS. 12 through 13.

As stated above, the magnetic memory device in accordance with exemplary embodiments of the invention includes a first write-in conductor disposed at a side of the MTJ structure and is used for a first programming mode, and a second write-in conductor disposed at the other side of the MTJ structure is used for a second programming mode. The magnetic memory device employs a single electric field during the programming operation. From this scheme, the magnetic memory device of exemplary embodiments of the invention does not need a precise alignment process for the MTJ structure and lines. As a result, the magnetic memory device of the exemplary embodiments of the present invention may minimize program disturbance and also provide an improved processing margin because the device may be formed without significant reliance on an alignment process.

Moreover, with the magnetic memory device of the exemplary embodiments, as the write-in currents flowing through the first and second write-in conductors, which are formed in the pattern of contact plugs, are vertically supplied toward a selected cell, the cell selectivity may be significantly improved by the electric field generated from the write-in conductors. As a result, the program disturbance of the magnetic memory device may be reduced.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A magnetic memory device comprising:
   a device isolation film confining an active region at a substrate having impurities of a first conductivity;
   a common line formed in the active region, the common line having impurities of a second conductivity;
   a first write-in semiconductor pattern, a readout semiconductor pattern and second write-in semiconductor pattern, which are each disposed on the common line, laterally separated from each other, and are each doped with impurities of the first conductivity;
a magnetic tunnel junction structure electrically connected to the readout semiconductor pattern and disposed on the readout semiconductor pattern;
first and second write-in conductors each disposed on the first and second write-in semiconductor patterns at both lateral sides of the magnetic tunnel junction structure, the first and second write-in conductors are each electrically connected to the first and second write-in semiconductor patterns;
a readout line electrically connected to the magnetic tunnel junction structure; and
first and second write-in lines each electrically connected to the first and second write-in conductors,
wherein a programming operation is divisionally carried out through a first programming mode using a first electric field generated by the first write-in conductor and a second programming mode using a second electric field generated by the second write-in conductor, and wherein a direction of the first electric field is reversed to a direction of the second electric field.

2. The magnetic memory device of claim 1, wherein the first write-in conductor is adapted to apply the first electric field of the first direction to the magnetic tunnel junction structure while the second write-in conductor does not generate the second electric field during the first programming mode, and wherein the second write-in conductor is adapted to apply the second electric field of the second direction to the magnetic tunnel junction structure while the first write-in conductor does not generate the first electric field during the second programming mode.

3. The magnetic memory device of claim 2, wherein the magnetic tunnel junction structure comprises:
a first magnetic layer having a fixed magnetization direction;
a second magnetic layer having a changeable magnetization direction; and
a tunnel barrier layer interposed between the first and second magnetic layers.

4. The magnetic memory device of claim 1, wherein one of the common line and readout line is correspondent with a word line while the other of the common line and readout line is correspondent with a bit line.

5. The magnetic memory device of claim 1, wherein one of the first and second conductivities is an N-type, while the other of the first and second conductivities is a P-type.

6. The magnetic memory device of claim 1, which further comprises:
a first write-in buffering pattern interposed between the first write-in semiconductor pattern and the common line;
a readout buffering pattern interposed between the readout semiconductor pattern and the common line; and
a second write-in buffering pattern interposed between the second write-in semiconductor pattern and the common line,
wherein the readout buffering pattern, and the first and second write-in buffering patterns are formed of semiconductors having impurities of the second conductivity, and wherein an impurity concentration for each of the readout buffering pattern and the first and second write-in buffering patterns is lower than an impurity concentration of the common line.

7. The magnetic memory device of claim 1, further comprising:

a first insulation film formed on the substrate;
a second insulation film covering the first insulation film, the readout semiconductor pattern, the first and second write-in semiconductor patterns, and the magnetic tunnel junction structure; and
an upper readout plug connected to an upward face of the magnetic tunnel junction structure and penetrating the second insulation film,
wherein the first and second write-in conductors each have plug shapes, penetrating the second insulation film, and the readout line is disposed on the second insulation film to connected to upper readout plug.

8. The magnetic memory device of claim 7, further comprising:
a third insulation film covering the second insulation film and the readout line; and
first and second upper write-in plugs penetrating the third insulating film and which are each electrically connected to the first and second write-in conductors,
wherein the first and second write-in lines are each connected to the first and second upper write-in plugs on the third insulation film.

9. The magnetic memory device of claim 8, further comprising:
a first landing pattern interposed between the first upper write-in plug and the first write-in conductor; and
a second landing pattern interposed between the second upper write-in plug and the second write-in conductor.

10. The magnetic memory device of claim 7, wherein the first insulation film covers the substrate around the readout semiconductor pattern and the first and second write-in semiconductor patterns,
wherein the first write-in conductor, the magnetic tunnel junction structure, and the second write-in conductor directly contact upward faces of the first write-in semiconductor pattern, the readout semiconductor pattern, and the second write-in semiconductor pattern, respectively.

11. The magnetic memory device of claim 7, further comprising:
a buffering insulation film disposed under the second insulation film to cover the first insulation film, upward faces of the first write-in semiconductor pattern, the readout semiconductor pattern and the second semiconductor pattern; and
a lower readout plug and first and second lower write-in plugs each penetrating the buffering insulation film and each connected to the readout semiconductor pattern, and the first and second write-in semiconductor patterns,
wherein the first insulation film covers the substrate around the readout semiconductor pattern and the first and second write-in semiconductor patterns,
wherein the first write-in conductor, the magnetic tunnel junction structure, and the second write-in conductor are each connected with the first lower write-in plug, the lower readout plug, and the second lower write-in plug, respectively.

12. The magnetic memory device of claim 7, further comprising:
a lower readout plug and first and second lower write-in plugs penetrating the first insulation film, wherein the lower readout plug and the first and second lower write-in plugs are each connected to the readout semiconductor pattern, and the first and second write-in semiconductor patterns, wherein the first insulation film covers the substrate, the readout semiconductor pattern, and the first and second write-in semiconductor patterns, wherein the first write-in conductor, the magnetic tunnel junction structure, and the second write-in conductor are each connected with the first lower write-in plug, the lower readout plug, and the second lower write-in plug, respectively.

13. The magnetic memory device of claim 1, further comprising a strapping line crossing over the readout line, and the first and second write-in lines, wherein the strapping line is electrically connected to the common line.

14. A magnetic memory device comprising:

a device isolation film confining an active region at a substrate having impurities of a first conductivity;

a common line formed in the active region, the common line having impurities of a second conductivity;

a first write-in semiconductor pattern, a readout semiconductor pattern and second write-in semiconductor pattern, which are each disposed on the common line, laterally separated from each other, and are each doped with impurities of the first conductivity;

a magnetic tunnel junction structure electrically connected to the readout semiconductor pattern and disposed on the readout semiconductor pattern;

first and second write-in conductors each disposed on the first and second write-in semiconductor patterns at both lateral sides of the magnetic tunnel junction structure, the first and second write-in conductors are each electrically connected to the first and second write-in semiconductor patterns;

a readout line electrically connected to the magnetic tunnel junction structure;

first and second write-in lines each electrically connected to the first and second write-in conductors;

a first write-in buffering pattern interposed between the first write-in semiconductor pattern and the common line;

a readout buffering pattern interposed between the readout semiconductor pattern and the common line; and a second write-in buffering pattern interposed between the second write-in semiconductor pattern and the common line, wherein the readout buffering pattern, and the first and second write-in buffering patterns are formed of semiconductors having impurities of the second conductivity, and wherein an impurity concentration for each of the readout buffering pattern and the first and second write-in buffering patterns is lower than an impurity concentration of the common line.

15. A magnetic memory device comprising:

a device isolation film confining an active region at a substrate having impurities of a first conductivity;

a common line formed in the active region, the common line having impurities of a second conductivity;

a first write-in semiconductor pattern, a readout semiconductor pattern and second write-in semiconductor pattern, which are each disposed on the common line, laterally separated from each other, and are each doped with impurities of the first conductivity;

a magnetic tunnel junction structure electrically connected to the readout semiconductor pattern and disposed on the readout semiconductor pattern;

first and second write-in conductors each disposed on the first and second write-in semiconductor patterns at both lateral sides of the magnetic tunnel junction structure, the first and second write-in conductors are each electrically connected to the first and second write-in semiconductor patterns;

a readout line electrically connected to the magnetic tunnel junction structure; and first and second write-in lines each electrically connected to the first and second write-in conductors;

a first insulation film formed on the substrate;

a second insulation film covering the first insulation film, the readout semiconductor pattern, the first and second write-in semiconductor patterns, and the magnetic tunnel junction structure; and an upper readout plug connected to an upward face of the magnetic tunnel junction structure and penetrating the second insulation film, wherein the first and second write-in conductors each have plug shapes, penetrating the second insulation film, and the readout line is disposed on the second insulation film to connected to upper readout plug.

* * * * *